(12) United States Patent
Diewald et al.

(10) Patent No.: US 8,225,155 B2
(45) Date of Patent: Jul. 17, 2012

(54) JTAG MAILBOX

(75) Inventors: Horst Diewald, Freising (DE); Volker Rzehak, Ergolding (DE); Johann Zipperer, Unterschleißheim (DE)

(73) Assignee: Texas Instruments Incorporated, Dallas, TX (US)

( * ) Notice: Subject to any disclaimer, the term of this patent is extended or adjusted under 35 U.S.C. 154(b) by 400 days.

(21) Appl. No.: 12/718,274

(22) Filed: Mar. 5, 2010

(65) Prior Publication Data
US 2010/0235698 A1   Sep. 16, 2010

(51) Int. Cl.
*G01R 31/28* (2006.01)
(52) U.S. Cl. .................. 714/727; 714/729
(58) Field of Classification Search ............... 716/136; 717/128; 714/30, 726, 727, 729
See application file for complete search history.

(56) References Cited

U.S. PATENT DOCUMENTS

| 5,771,240 | A | | 6/1998 | Tobin et al. | |
|---|---|---|---|---|---|
| 5,983,379 | A | * | 11/1999 | Warren | 714/727 |
| 6,189,140 | B1 | * | 2/2001 | Madduri | 717/128 |
| 6,631,504 | B2 | * | 10/2003 | Dervisoglu et al. | 716/136 |
| 6,665,816 | B1 | * | 12/2003 | Edwards et al. | 714/30 |
| 6,886,121 | B2 | * | 4/2005 | Dervisoglu et al. | 714/726 |
| 7,181,705 | B2 | * | 2/2007 | Dervisoglu et al. | 714/727 |

OTHER PUBLICATIONS

IEEE Computer Society, "IEEE Standard Test Access Port and Boundary-Scan Architecture", Jun. 14, 2001, Entire Document, Institute of Electrical and Electronics Engineers, Inc., New York, NY.

* cited by examiner

*Primary Examiner* — David Ton
(74) *Attorney, Agent, or Firm* — Robert D. Marshall, Jr.; Wade James Brady, III; Frederick J. Telecky, Jr.

(57) ABSTRACT

An electronic device comprises a processing stage, a JTAG port including a test data input pin (TDI), a test data output pin (TDO), a test mode select pin (TMS), a test clock pin (TCK), and a test access port (TAP) controller having a data register (DR) shift state and an instruction register shift (IR) state. The electronic device operates in a scan event mode automatically mapped an incoming event to the TDO pin.

12 Claims, 23 Drawing Sheets

FIG. 20
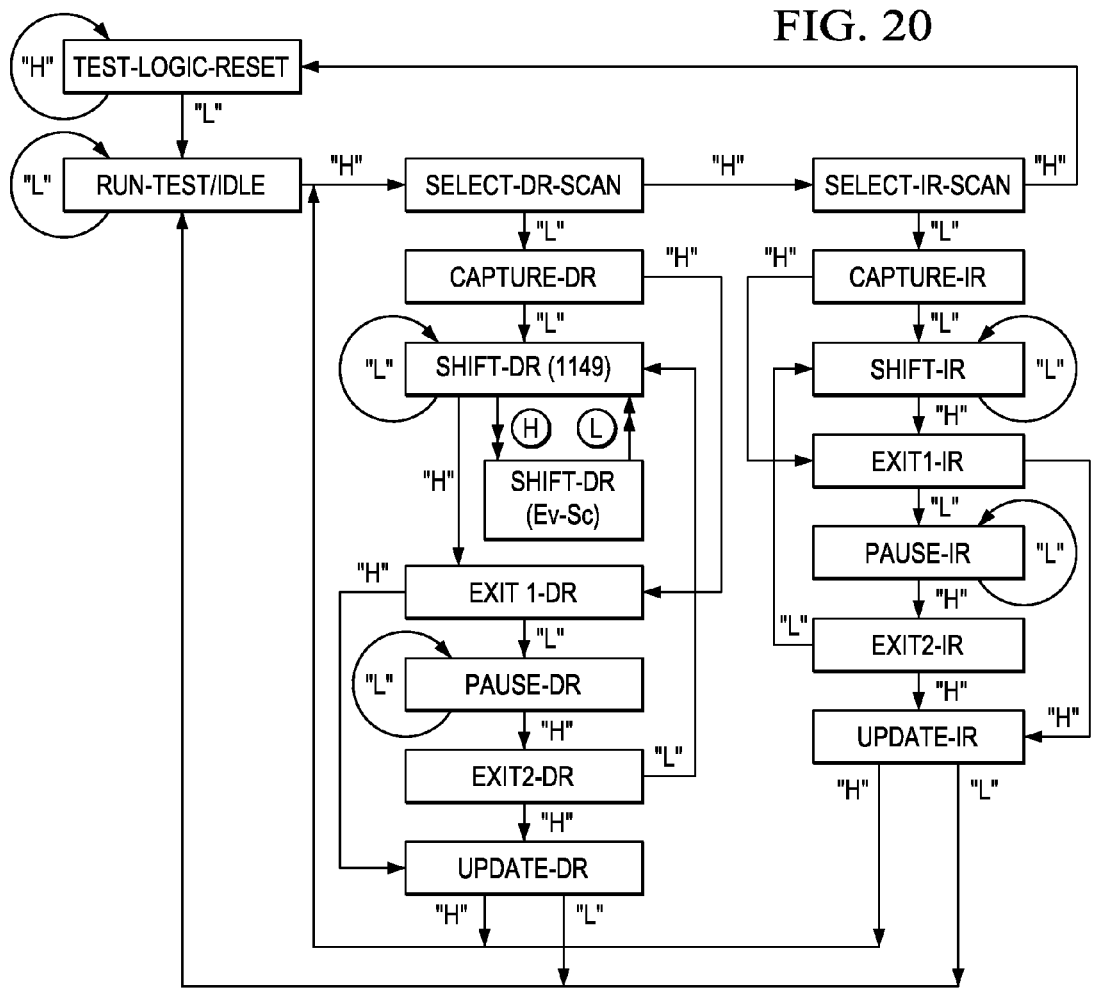
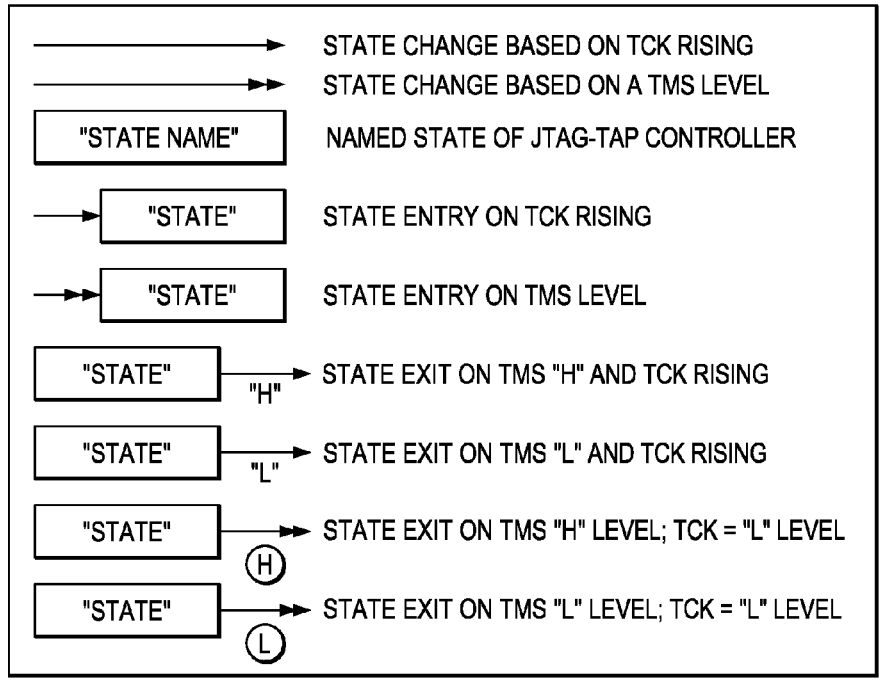

JTAG MAILBOX

CLAIM OF PRIORITY

This application claims priority under 35 U.S.C. 119(a) to German Patent Application No. 10 2009 012 768.2 filed Mar. 12, 2010.

TECHNICAL FIELD OF THE INVENTION

The technical field of this invention is electronic devices using a JTAG port.

BACKGROUND OF THE INVENTION

A group of European electronics companies formed a consortium called the Joint Test Action Group (JTAG). The consortium devised a specification for boundary-scan hardware testing at the IC level. In 1990 the Joint Test Action Group established a standard IEEE 1149.1 that details access to any chip with a so-called JTAG port.

The IEEE 1149.1 JTAG specification uses boundary-scan technology to enable engineers to perform extensive debugging and diagnostics on a system through a small number of dedicated test pins. Signals are scanned into and out of the I/O cells of a device serially to control its inputs and test the outputs under various conditions. Boundary-scan technology is probably the most popular and widely used design-for-test technique in the industry today.

FIG. 1 illustrates a typical prior art set-up including a test system and a device under test (DUT). The test system controls accesses to the DUT via the JTAG ports. In this embodiment, the test system and the DUT are coupled through five lines. The boundary-scan control signals are collectively referred to as the test access port (TAP, not shown). The TASP defines a serial protocol for scan-based devices. There are five pins: TCK, TMS, TDI, TDO and TRST. The TCK, TMS, and TRST input pins drive a 16-state TAP controller (state machine, not shown). The TAP controller manages the exchange of data and instructions. The controller advances to the next state based on the value of the TMS signal at each rising edge of TCK. Pull-up resistors couple to TRST, TMS and TCK lines to power supply Vcc.

Some test equipment and ASIC-cell companies have defined proprietary extensions that use the JTAG capability to implement software debug functions. With the proper support built into a target CPU, this interface may be used to download code, execute it, and examine register and memory values. These functions cover the majority of the low-level functionality of a typical debugger. An inexpensive remote debugger can be run on a workstation or PC to assist in software debugging.

Boundary-scan technology is also used for emulation. FIG. 2 illustrates a prior art test set-up. The emulator front-end acts as the scan manager by controlling the delivery of scan information to and from the device under debug and the debugger window. When a host controls the JTAG scan information, it needs to know if other devices are connected in the scan chain. The JTAG debugger generally duplicates (emulations) the functions of the device under debug. Thus the JTAG debugger behaves like the device under debug or at least can monitor how the device under debug behaves. Controlling the emulation requires an exchange of event related data between the JTAG debugger and the device under debug. In computing an event is defined as an action that is usually initiated outside the scope of a program and that is handled by a piece of code inside the program. Typically events are handled synchronous with the program flow. The program generally has one or more dedicated places where events are handled. The term event covers both synchronous and asynchronous events. An interrupt, which is also regarded as an event, is an asynchronous signal from hardware indicating the need for attention or a synchronous event in software indicating the need for a change in execution. A hardware interrupt causes the processor to save its state of execution via a context switch and begin execution of an interrupt handler. Software interrupts are usually implemented as instructions in the instruction set, which cause a context switch to an interrupt handler similar to a hardware interrupt. Interrupts are a commonly used technique for computer multitasking especially in real-time computing. Typical sources of events include the user pressing a key on the keyboard or hardware devices such as a timer. A computer program that changes its behavior in response to events is said to be event-driven. The goal is often of being interactive. Debugging also requires placing specific breakpoints, jumps or branching within the program flow in the device under debug. This means that events may also relate to interactions of the debugger and the DUT.

FIG. 2 illustrates two additional lines in prior art JTAG ports coupling the JTAG debugger and the device under debug in order to handle and exchange events. Lines EMU0 and EMU1 exchange events. The JTAG and emulation related data is passed through lines TDO and TDI. Corresponding control signals are passed through lines TMS and TCK. JTAG allows the internal components of the device under test (the CPU, for example) to be scanned using this principle. JTAG may be used to debug embedded devices allowing access to any part of the device that is accessible via the CPU and still test at full speed. This has become a standard emulation debug method used by silicon vendors. This requires numerous extra pins on a device under debug to provide additional system integration capabilities for benchmarking, profiling and system level breakpoints.

SUMMARY OF THE INVENTION

In an embodiment of the invention, an electronic device comprises a processing stage (for example a CPU, DMA, embedded microcontroller) and a JTAG port with a test data input pin (TDI), a test data output pin (TDO), a test mode select pin (TMS), a test clock pin (TCK) and a test access port (TAP) controller. The TAP controller has a data register (DR) shift state and an instruction register shift (IR) state. The electronic device operates in a scan event mode in which an incoming event is automatically mapped to the TDO pin. In this embodiment a specific mode of the electronic device is implemented. In this mode called a scan event mode, events are passed without delay to the TDO pin of the JTAG port. Using the TDO pin reduces the total number of pins needed. The scan event mode minimizes overhead and delays.

The electronic device also automatically forwards an event received through the TDI pin to the TDO pin in scan event mode. The scan mode may especially be used to accelerate the through put of events received from other devices.

In another embodiment of the invention, an electronic device comprises a processing stage (for example a CPU, DMA, embedded microcontroller etc.) and a JTAG port with a test data input pin (TDI), a test data output pin (TDO), a test mode select pin (TMS) and a test clock pin (TCK). The electronic device comprises a test access port (TAP) controller having a data register (DR) shift state and an instruction register shift (IR) state. A first register stores an event for the processing stage received through the TDI pin. This register receiving events through the TDI pin enables the electronic device to use the TDI pin instead of any additional pins for emulation.

The first register provides a flag to the processing stage indicating that the event is stored in the register. This flag efficient communicates without directly intervening with program flow.

The electronic device issues an interrupt to the processing stage in response to the reception of the event. This is appropriate if the event requires immediate service.

The electronic device comprises a second register for storing an event received from the processing stage. This enables exchanging events.

The electronic device feeds the event from the second register as serial data to the TDO pin. The TDO pin communicates events allowing the number of pins to be reduced.

The electronic device feeds the event to the TDO pin during a DR-shift state of the TAP controller. This is a very efficient position in the control flow of a JTAG for establishing the communication of events through the respective TDO and TDI pins.

The TDI and TDO pins of the electronic device (e.g. a microcontroller, integrated circuit etc.) are coupled to each other within the electronic device. In an advantageous embodiment, the TDI pin and the TDO pin are coupled to asynchronously feed a received high level event from the TDI pin to the TDO pin. This allows events to be immediately passed through the electronic device without having wait for a clock edge of TCK. This can be advantageous in embodiments using a daisy chain configuration where events from devices have to pass through other devices.

In still another embodiment of the invention, an electronic device comprises a JTAG port which automatically reports events from a processing stage through the TDO pin of a JTAG port. This embodiment achieves a reduced pin number and a high processing speed.

The electronic device may be a master device coupled to a second electronic device through a JTAG port for testing the second device. The electronic device receives an event automatically transmitted from the TDO pin of a JTAG port. This provides the above mentioned advantages when used with other electronic devices having a JTAG port configured according to the invention. The electronic device comprises a dispatcher coupled to a TDI pin for receiving an event from the TDI pin. The dispatcher detects and further processes events.

Another aspect of the invention is a method of operating an electronic device with a JTAG port. An instruction is sent to the electronic device to switch to a scan event mode. In the scan event mode the electronic device automatically reports an event through a TDO pin of the JTAG port.

The invention is also a method of testing an electronic device through a JTAG port. An instruction is sent to the electronic device to switch the device into a scan event mode automatically reporting an event through a TDO pin of the JTAG port.

A signal propagates to a TDI pin of a JTAG port representing an instruction switching the JTAG port into a scan event mode. In the scan event mode events are automatically reported. Another signal reports an event of a device under test to a tester through a JTAG interface. The signal is issued through a TDO pin of the JTAG pin and received through TDI pin of other devices under test and/or the tester. Further signals can be derived from the aspects of the invention.

In an advantageous aspect of the invention, a system comprises plural electronic devices having JTAG ports. The electronic devices are coupled in a daisy chain through respective TDI pins and TDO pins of their JTAG ports. The JTAG ports are then configured in according to the invention as set out above. The JTAG ports asynchronously forward events.

Furthermore, a data protocol transmits event related data through a TDO pin and/or a TDI pin of a JTAG port. The protocol passes an instruction through a TDO pin and/or a TDI pin of an electronic device to switch the device under test into an event scan mode in which events are automatically reported through a TDO pin.

These aspects and embodiments of the invention avoids time delays due polling by a tester. The devices under test report and transmit their events with only delays from prioritization. A tester analyzes the data from a whole daisy chain of devices to determine whether and which kind of event is present. The invention allows direct reporting and transmission of events from a DUT to the tester avoiding many inherent restrictions of JTAG configurations with minimum modifications.

BRIEF DESCRIPTION OF THE DRAWINGS

These and other aspects of this invention are illustrated in the drawings, in which:

FIG. 20 is a state diagram of a TAP controller of a JTAG port according to an embodiment of the invention;

DETAILED DESCRIPTION OF PREFERRED EMBODIMENTS

Figure 3:
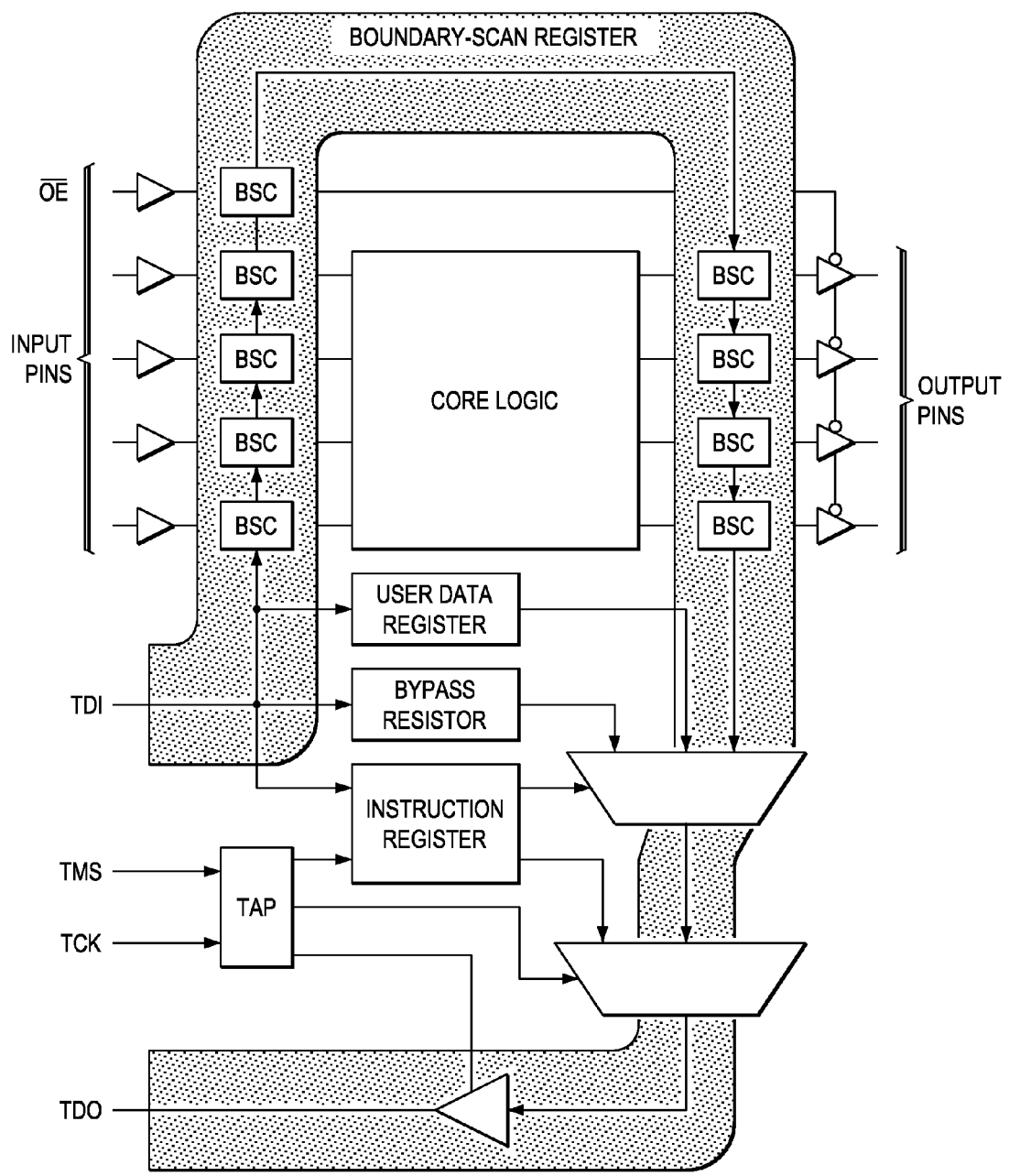
FIG. 3 is a circuit diagram of the general structure of a prior art JTAG test interface.

FIG. 3 illustrates the general structure of a JTAG boundary scan test interface according to the prior art. All the signals between the core logic and the pins are intercepted by a serial scan path known as the boundary scan register (BSR) including boundary scan cells (BSC). In normal system operation this path transparently connects the core-logic signals to the pins and effectively become invisible. In external-test mode, this path can disconnect the core-logic from the pins, drive the output pins by itself, and read and latch the states of the input pins. In internal-test mode, this path can disconnect the core-logic from the pins, drive the core-logic input signals by itself, and read and latch the states of the core-logic output signals.

There are different types of BSCs including input cells, output cells and enable cells. Input cells are always associated with a specific pin whose state they capture when the JTAG interface is in external test mode. Output cells are always associated with a specific pin which they drive when the JTAG interface is in external test mode. Enable cells are not associated with any pin per-se, but they either control the direction of bidirectional pins or enable and disable certain input or output pins.

Gates (not shown) associated with the BSCs and under the control of the TAP controller and optionally also under the control of enable cells may capture or apply the states (contents) of the respective input or output cells to or from the pins. This state capture or application, takes place during certain transitions of the TAP controller which may be a state-machine. This state capture takes place only if the instruction register IR has been previously loaded with and contains the proper opcode. Other gates (not shown) may operate only when the system is in normal-operation mode and the JTAG test apparatus is inactive. These other gates connect the pins to the internal core-logic signals as if the boundary scan path was not present.

The contents of the BSR can be written to and read from bit-after-bit in a serial fashion using the TDI and TDO JTAG signals. Actually BSR read and write operations take place at the same time. The new value is shifted in from TDI, while the previous value is shifted out from TDO. The same technique is used to read and write the values of the other JTAG registers. The TAP controller connects them between the TDI and TDO pins instead of the BSR.

The JTAG interface uses the following five dedicated signals which must be provided on each chip that supports the standard. The test reset signal (TRST) is optional and it initializes and disables the test interface. The test clock (TCK) is the test clock input which controls the timing of the test interface independent any system clocks. The test mode select (TMS) selects input signal which controls the transitions of the test interface state machine. The test data input (TDI) supplies the data to the JTAG registers including the boundary scan register BSR, the instruction register IR and other data registers DR. The test data output (TDO) serially outputs data from the JTAG registers to the equipment controlling the test. The TDO carries the sampled values from the boundary scan chain or other JTAG registers and propagates them to the next chip in the serial test circuit.

The normal organization of the test circuit on a board that incorporates several chips with JTAG support connects the optional TRST, TCK and TMS to every chip in parallel and connects TDO from one chip to TDI of the next in a single daisy chain loop. The board thus presents a single test interface that has the same five signals discussed above. A simpler arrangement, for boards that have only a few chips with JTAG interfaces, provides one JTAG test-port for every such chip and controls the tests independently.

Figure 4:
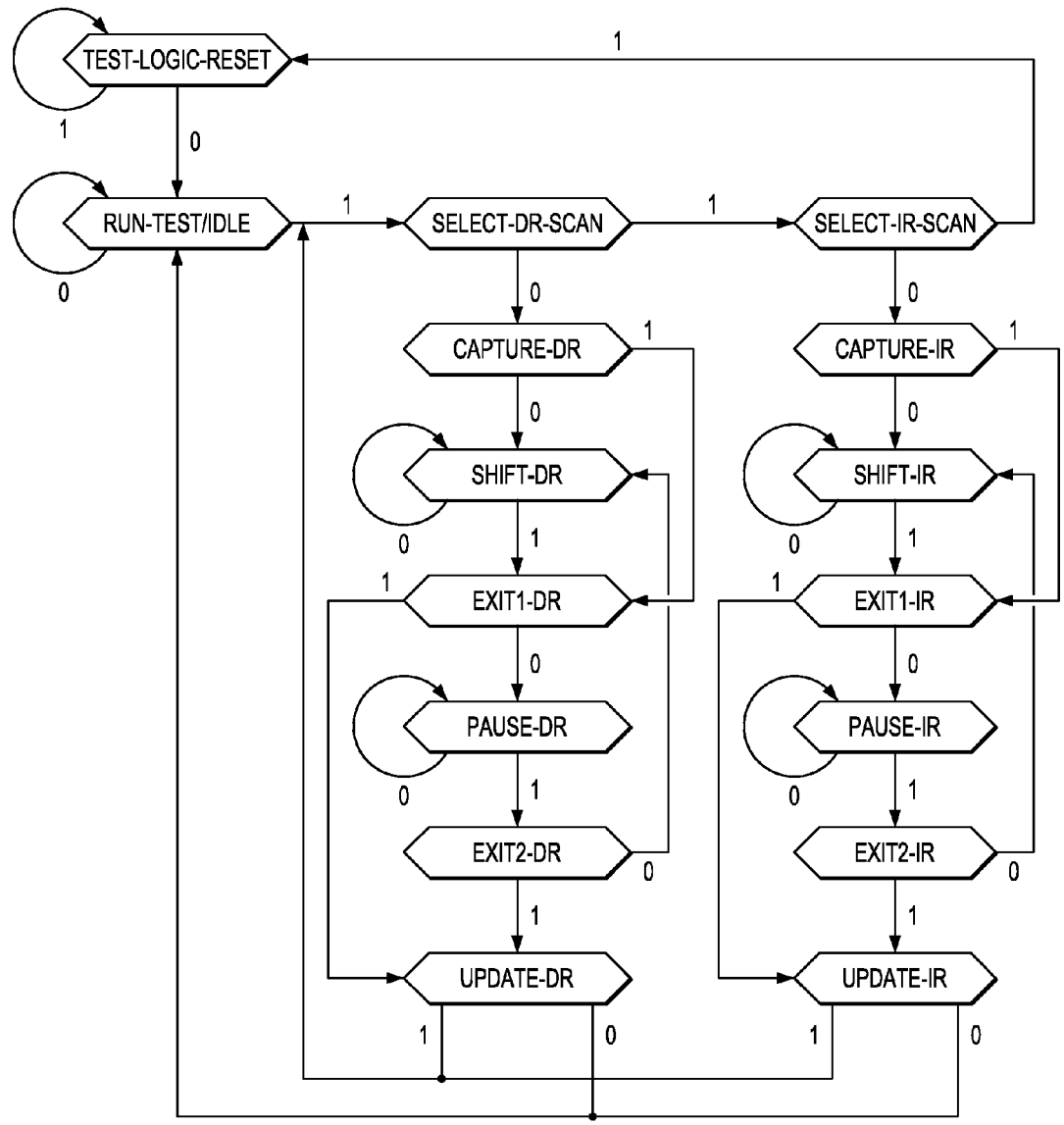
FIG. 4 is a state diagram of a TAP controller of a JTAG port according to the prior art.

The operation of the test interface is controlled by the test access port TAP controller. This may be a state-machine with the state transitions controlled by the TMS signal. FIG. 4 is a prior art state-transition diagram. All states have two exits so all the transitions can be controlled by the single signal TMS. The two main paths in the state transition diagram control the operations on the data registers including the ID register, the bypass register and the BSR register, and the instruction register. The data register is selected based on the value loaded in the instruction register IR. The following state sequence loads a new value into the instruction register IR and to read a previous value back: (1) Test-Logic-Reset; (2) Run-Test/Idle; (3) Select-DR-Scan; (4) Select IR-Scan; (5) Capture-IR; (6) Shift-IR; (7) repeat Shift-IR n times as necessary; (8) Exit1-IR; (9) Update-IR; and then (10) Run-Test/Idle again. The new value is shifted-in the instruction register from the TDI line in a bitwise manner one bit at a time after entering the Shift-IR state. The previous value of the instruction register IR is shifted-out the TDO line bitwise after leaving the Shift-IR state.

The following transition path or state sequence loads a new value into the currently selected Data Register and reads the previous value out: (1) Test-Logic-Reset; (2) Run-Test/Idle; (3) Select-DR-Scan; (4) Capture-DR; (5) Shift-DR; (6) repeat Shift-DR n times as necessary; (7) Exit1-DR; (8) Update-DR; and then (9) Run-Test/Idle again. Similar to the instruction register, the new value is shifted-in the currently selected data register DR from the TDI line bit-by-bit after having entered the Shift-DR state. The previous value of the current selected data register DR is shifted-out to the TDO line bit-by-bit when leaving the Shift DR state.

The shifted out value of the instruction register is captured on entering into the Capture-IR state. The value of the currently selected data register DR is captured when entering into the Capture-DR state. The new value shifted in the instruction register is applied and the instruction takes effect when entering into the Update-IR state. The value of the currently selected data register is applied and transferred to the output pins in case of the BSR when entering into the Update-DR state.

The specific steps and sequences of the test operation are affected by the contents of the instruction register IR. This selects between various different data registers for operation in the DR-path. The following data-registers are present in almost any JTAG implementation: the device ID register (IDR) reads-out an identification number which is hardwired in the chip; the bypass register BR is a 1-cell pass-through register which connects the TDI to the TDO with a 1-clock delay to give test equipment easy access to another device in the test chain on the same board; and the boundary scan register BSR described in detail above intercepts all the signals between the core-logic and the pins. Other registers may also be present on the chip to perform other test operations.

A JTAG test operation is normally performed by entering an instruction which specifies the type of test to be performed and the data register to be used during this test, into the instruction register using the TAP through an IR-path. The JTAG test then uses the Data Register to perform the test using TAP through one or more DR-paths.

With the proper wiring, multiple ICs or boards may be tested simultaneously. An external file known as a Boundary-Scan Description Language (BSDL) file defines the capabilities of any single device boundary-scan logic.

Figure 1:
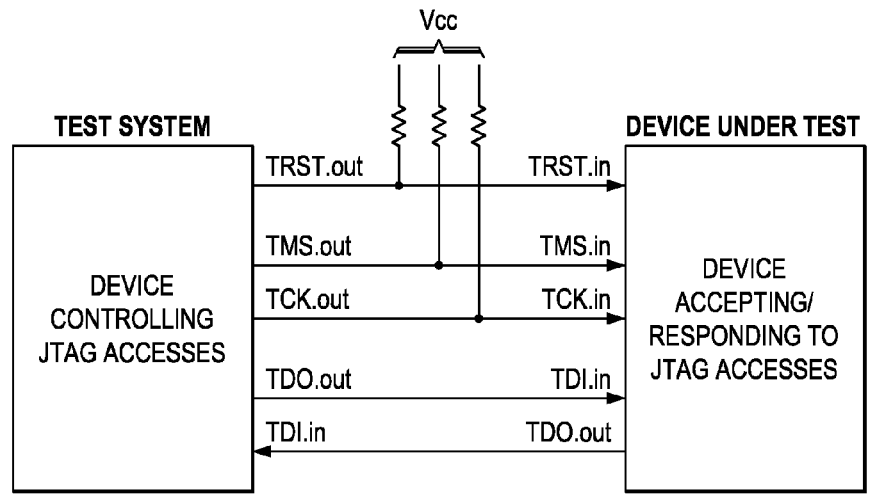
FIG. 1 is circuit diagram of an example of a test system and a device under test using a JTAG port according to the prior art.
Figure 5:
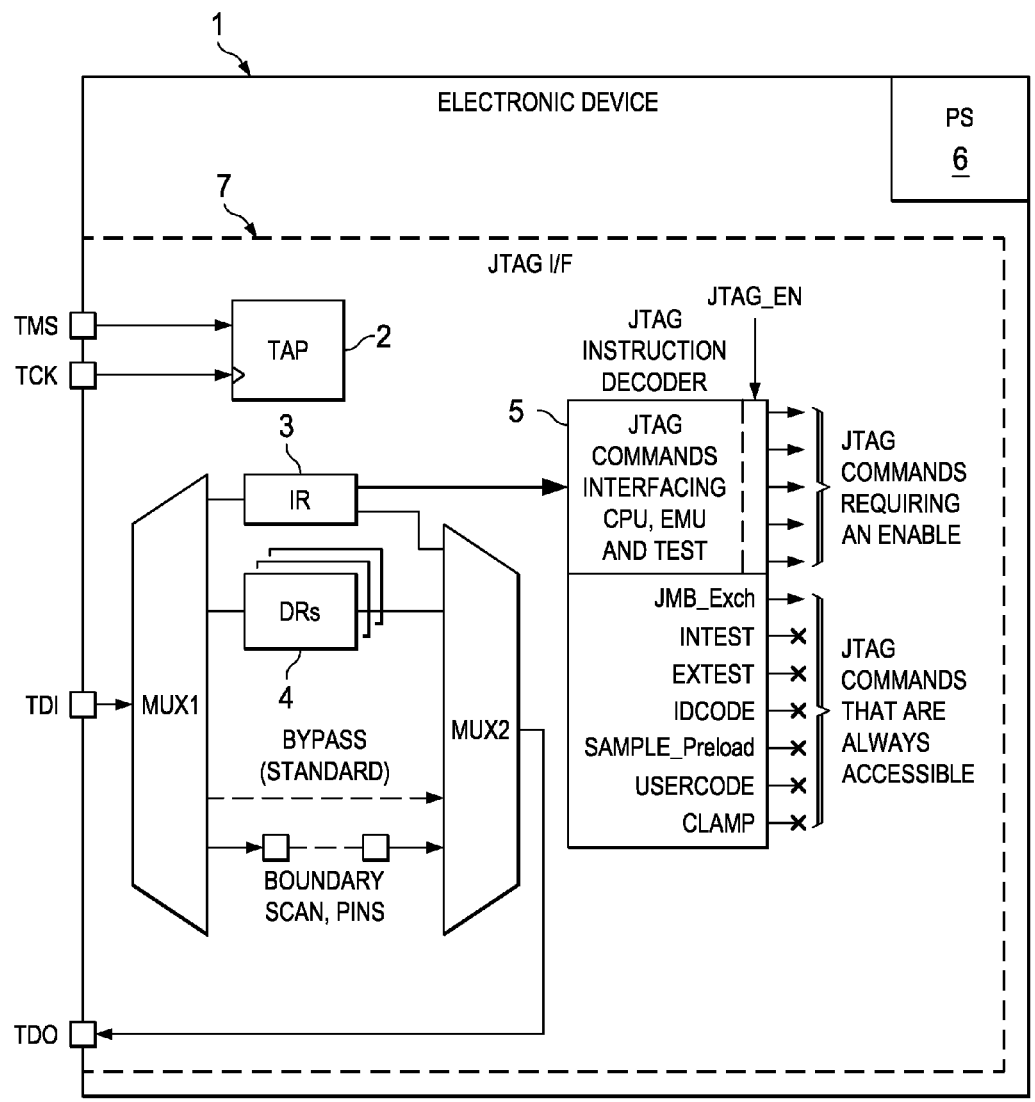
FIG. 5 is a block diagram of a JTAG port according to the prior art to be used in the test system of FIG. 1.

FIG. 5 is a block diagram of electronic device 1 with a processing stage 6 such as a CPU or DMA and a JTAG port or interface 7 according to the prior art of the test system of FIG. 1. TAP controller 2 is coupled to receive clock signal TCK and the test mode select input signal TMS. Instruction register IR 3 and data registers DRs 3 are coupled to receive input data from test data input pin TDI and to pass data to test data output pin TDO through respective multiplexers MUX1 and MUX2 controlling the data path. There is also a standard boundary scan path and a bypass path coupled between multiplexers MUX1 and MUX2 for either selectively passing data directly and synchronously from TDI to TDO or selectively receiving data from pin TDI or feeding data to pin TDO from boundary scan registers as previously explained. Instructions such as commands and operational code (opcode) stored in instruction register IR 3 are passed to JTAG instruction decoder 5 which decodes the instructions and issues corresponding JTAG commands. JTAG instruction decoder 5 is enabled via enable signal JTAG EN. There are two groups of commands: private commands which need to be enabled; and public commands which are always available. Private commands requiring enabling the JTAG decoder 5 are commands which relate to processing stage 6, emulation and test. Public instructions are documented by the chip manufacturer and available for general use. Private instructions may not be made available. The IEEE-1149.1 standard defines a mandatory set of public instructions that must be present in all compliant JTAG implementations. This mandatory set contains the following instructions. In the BYPASS command the TDI and TDO lines are connected to single-bit pass-through register which passes to TDI to the TDO with a single-clock delay allowing testing of other devices connected to the same test-loop. In the EXTEST command the boundary scan register (BSR) is connected between the TDI and the TDO signals. The device pin states are sampled and captured by the BSR cells at the entry to the Capture-DR state as shown in FIG. 4. The contents of the BSR register are shifted out via the TDO line at exits from the Shift-DR state. As the contents of the BSR (the captured data) are shifted out, new data are sifted in at the entries to the Shift-DR state. The new contents of the BSR are applied to the pins during the Update-DR state. In the IDCODE command the ID register is connected between the TDI pin and the TDO pin. When entering into the Capture-DR state the Device ID Code which is a hard-wired identification number containing the manufacturer code, a part number and a revision code is loaded into the register. This number is shifted out at the exits of the Shift-DR states. In the INTEST command the boundary scan register (BSR) is connected between the TDI and the TDO signals. The internal core-logic signals are sampled and captured by the BSR cells when entering into the Capture-DR state as shown in TAP controller state transition diagram of FIG. 4. The contents of the BSR register are shifted out via the TDO line at exits from the Shift-DR state. As the captured data contents of the BSR are shifted out, new data is sifted in when entering into the Shift-DR state. The new contents of the BSR are applied to the core-logic signals during the Update-DR state. Further public commands SAMPLE_PRELOAD, USERCODE and CLAMP are not relevant to the invention.

Figure 2:
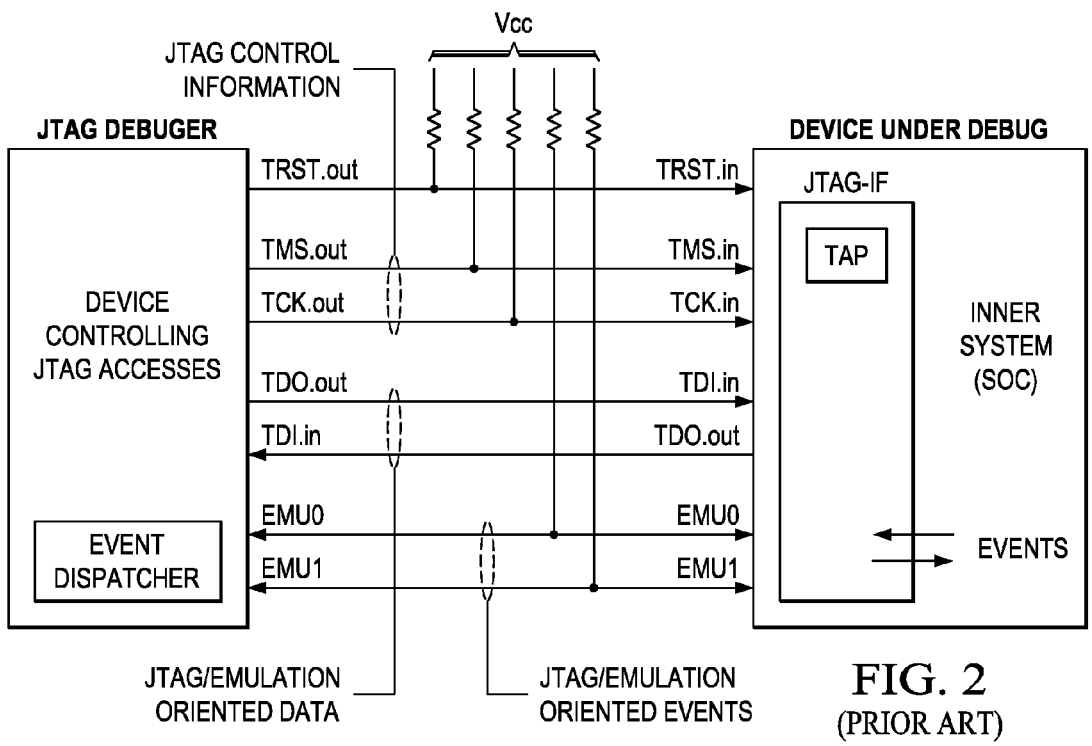
FIG. 2 is a circuit diagram of an example of a test system and a device under test using a JTAG port with emulation capability according to the prior art.
Figure 6:
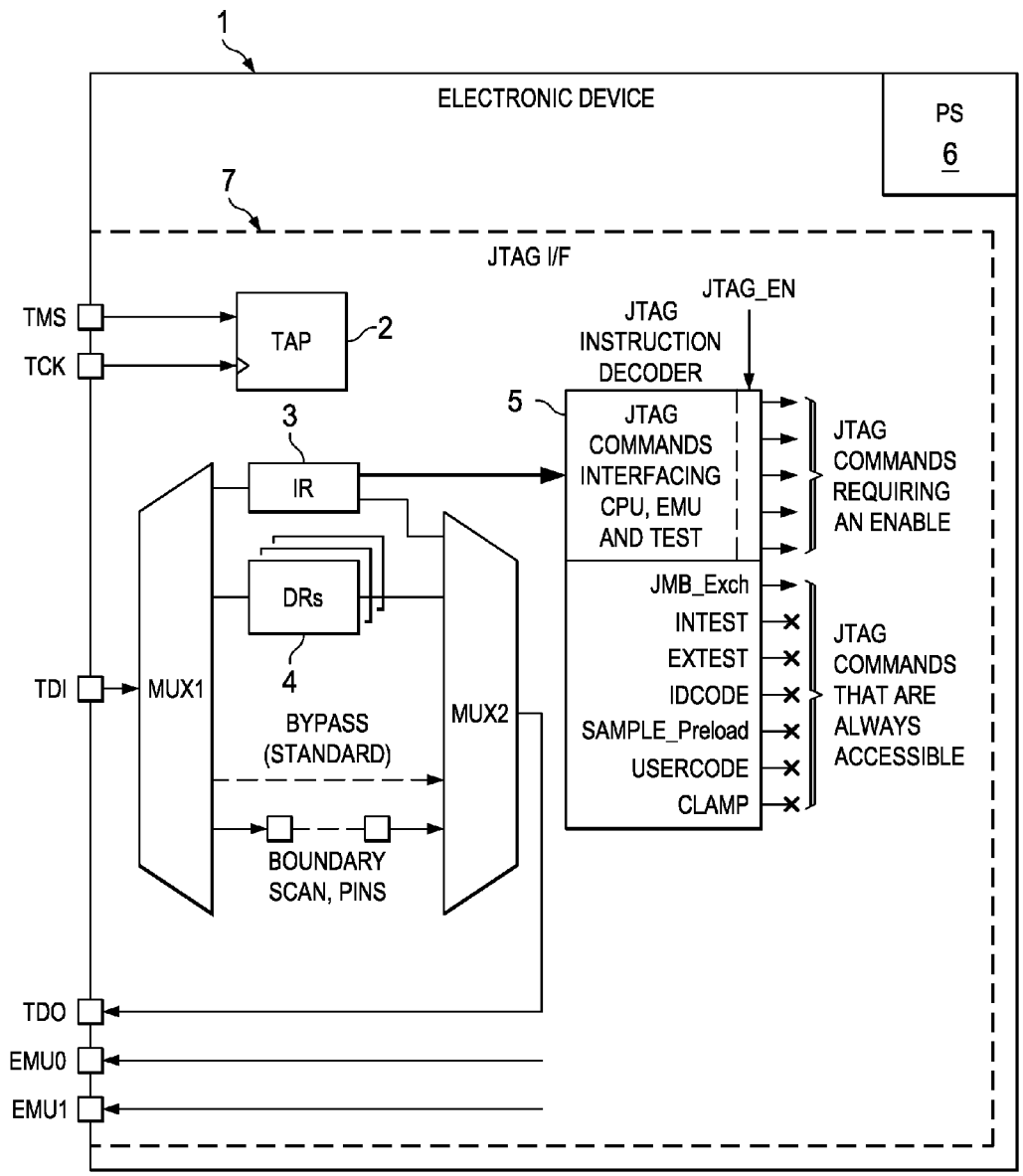
FIG. 6 is a block diagram of a JTAG port according to the prior art to be used in the test system of FIG. 2.
Figure 7:
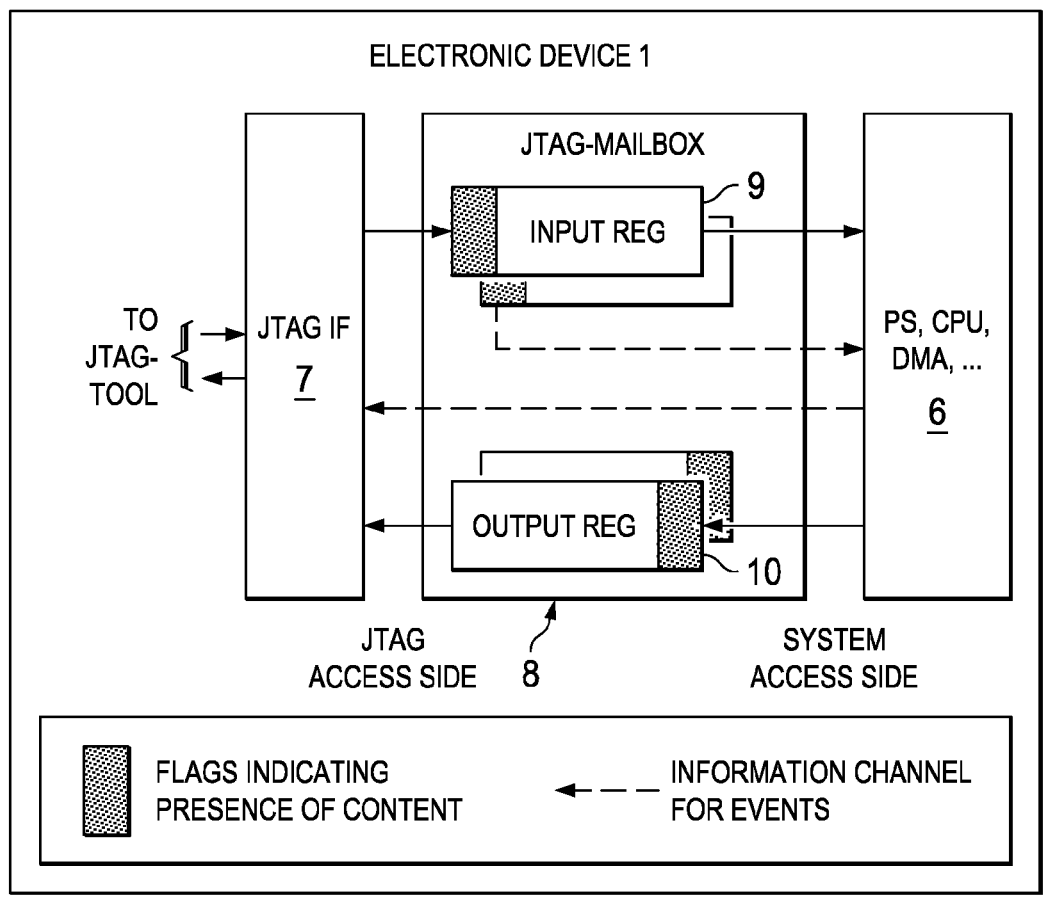
FIG. 7 is a block diagram of an electronic device according to an embodiment of the invention illustrating the JTAG mailbox concept.

FIG. 6 is a block diagram of electronic device 1 with a JTAG port 7 according to the prior art to be used in the test system of FIG. 2. FIG. 7 illustrates JTAG port 7 includes two emulation pins EMU0 and EMU1 in addition to the standard test pins of the JTAG port 7 shown in FIG. 5. These additional emulation pins are used for exchanging events with other devices.

FIG. 7 is a block diagram of electronic device 1 according to an embodiment of the invention. FIG. 7 illustrates basic aspects of the JTAG mailbox concept. A called JTAG mailbox 8 is coupled between JTAG interface 7 and processing stage 6. JTAG interface 7 may be implemented as previously described with respect to the prior art devices shown in FIG. 1 and FIG. 5. JTAG interface 7 may have pins TDI, TDO, TMS and TCK as well as TRST, but no additional emulation lines EMU0 are required. Processing stage 6 may be a CPU or a DMA. JTAG mailbox 8 provides an information channel for events from the system (processing stage 6) to the JTAG interface 7. JTAG mailbox 8 may also provide an information channel from JTAG interface 7 to processing stage 6. JTAG mailbox 8 includes one or more registers 9 and 10 to establish a communication channel for respective events. Registers 9 and 10 latch or store data relating to events. This event related data may either be received from the JTAG interface through pin TDI or it may be received from processing stage 6. Event related data from processing stage 6 is latched or stored in output register 10. Event related data received through JTAG interface 7 is latched or stored in input register 9. A flag indicates that any of these registers contain data. The flag indicates that an event occurred and that event related data arrived from either processing stage 6 side or JTAG interface 7. An embodiment includes a distinct interface extension (hook) for propagating and/or communicating the events. FIG. 7 includes dashed lines representing the event flow direction and the other lines representing the interconnections realizing event flow. FIG. 7 illustrates a direct signaling of events from processing stage 6 to JTAG interface 7 and from there to the tester. This is advantageous because using a flag in output register 10 and reacting to this flag may be too slow. The direct connection illustrated in FIG. 5 bypasses register 10. In a conventional system, the tested initiates all actions relating to an event. However, according to these aspects and embodiments of the invention an event can be actively reported from the device under test to the tester.

Figure 8:
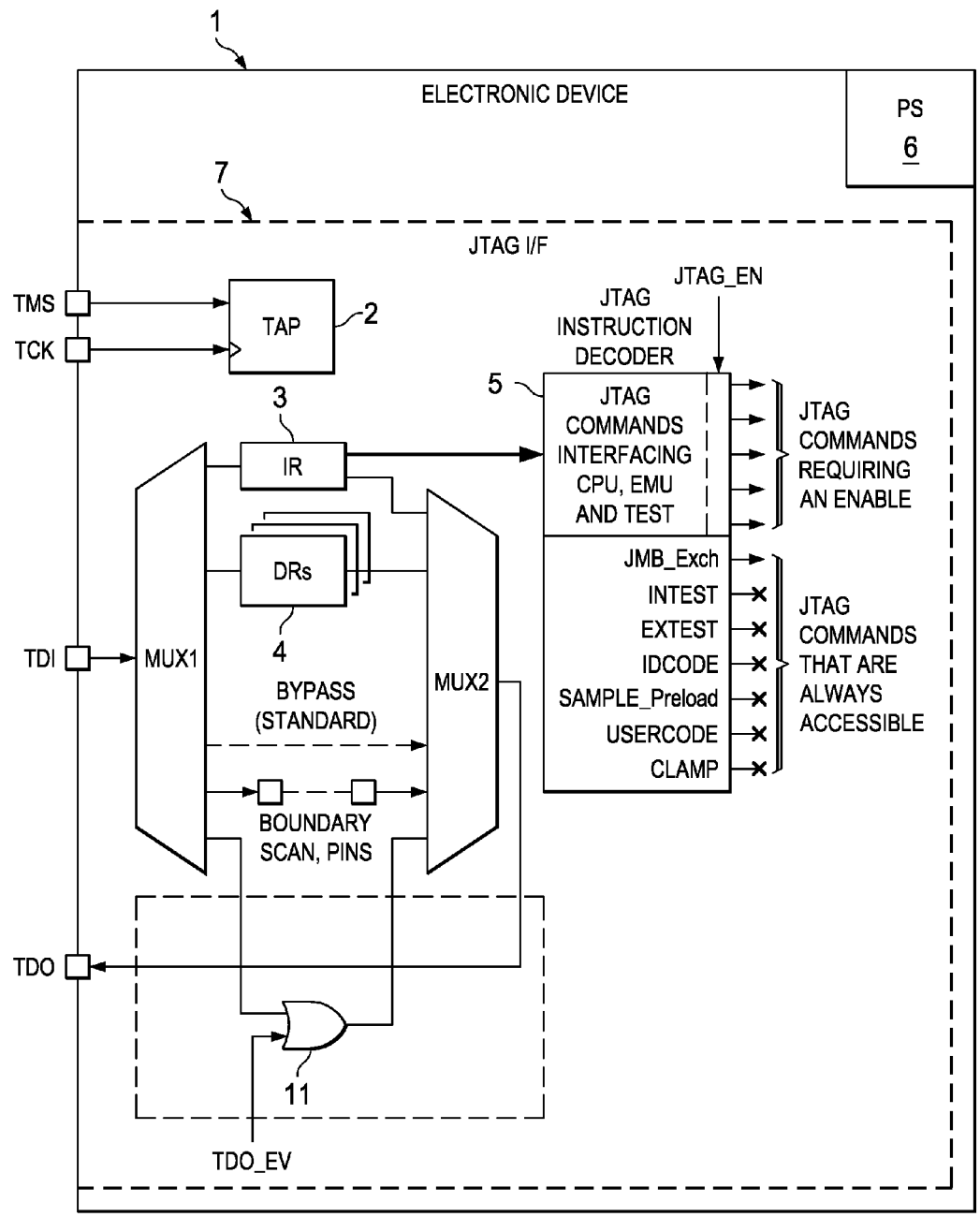
FIG. 8 is a block and circuit diagram of an electronic device according to an embodiment of the invention with synchronous event reporting.

FIG. 8 is a block and circuit diagram of electronic device 1 according to an embodiment of the invention with synchronous event reporting. Most parts of the electronic device are similar to the embodiments shown in FIGS. 5 and 6. TAP controller 2 provides control signals for multiplexers MUX1 and MUX2 (control signals not shown). Multiplexers MUX1 and MUX2 may use clock signals such as TCK for synchronous operation. This is also not shown in FIG. 8 and the following figures. FIG. 8 illustrates an additional gate OR gate 11 coupled between multiplexers MUX1 and MUX2. The input of OR gate 11 is coupled to MUX1 which is coupled to receive data from input pin TDI. The output of OR gate 11 is coupled to MUX2 which is coupled to pin TDO. A second input of OR gate 11 receives signal TDO_EV. If signal TDO_EV is high data can not pass through OR gate 11 from TDI to TDO as the output of OR gate 11 is always high. If TDO_EV is low OR gate 11 establishes a data path for passing data from TDI to TDO. If the logic level of TDO_EV is controlled in accordance with event related data received at pin TDI, event related data may be directly fed through the device. The embodiment of FIG. 8 provides an efficient means for feeding either event related data from the electronic device to pin TDO using signal TDO_EV or from another electronic device through this electronic device in a daisy chain. The standard bypass path and related commands are not used for event related data. The control signal TDO_EV may be output from register 10 of JTAG mailbox 8 shown in FIG. 7. The embodiment shown in FIG. 8 may not have sufficient data throughput because the bypass for event related data through OR gate 11 is implemented similarly to the standard bypass path. This only supports clock synchronous data propagation. Thus TCK clock edges are required for propagating data through the multiplexer MUX2. This applies to this embodiment and the other embodiments of the invention.

Figure 9:
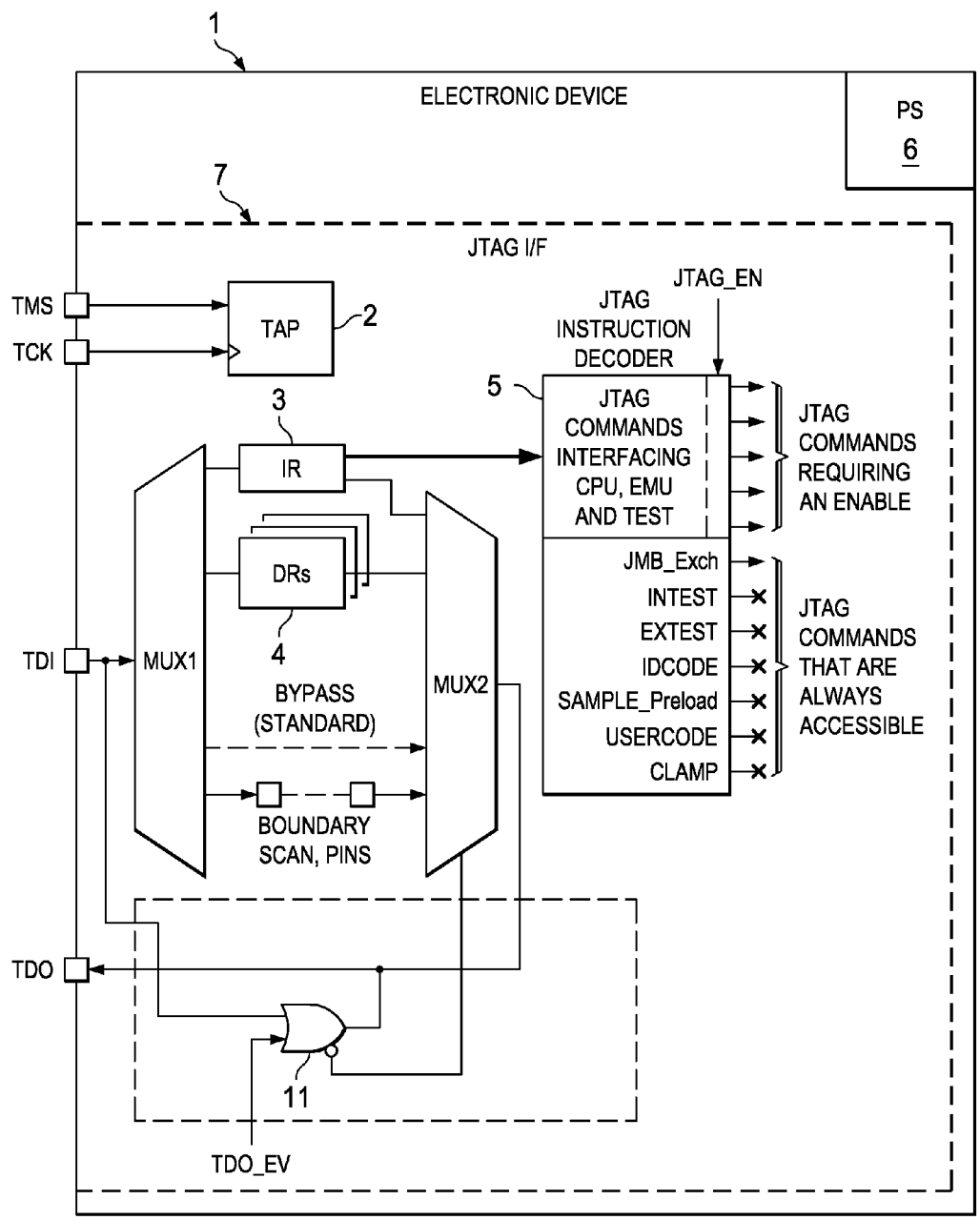
FIG. 9 is a block and circuit diagram of an electronic device according to an embodiment of the invention with asynchronous event reporting.

FIG. 9 is a block and circuit diagram of electronic device 1 according to an embodiment of the invention with asynchronous event reporting. The embodiment of FIG. 9 is generally similar to FIG. 8. The input of gate 11 is directly coupled to the TDI pin and the output of gate 11 is directly coupled to pin TDO avoiding multiplexers MUX1 and MUX2. Either data from TDI or data gated by the TDO_EV input of OR gate 11 can asynchronously feed TDO. This increases data throughput for events and event related data received at pin TDI and provides asynchronous reporting of events with signal TDO_EV. OR gate 11 has an additional control input to switch into a high impedance output state (tri-state). The control signal for switching the OR gate can be issued from TAP controller 2. MUX2 may then be switched off, if an event is reported. This means that either MUX2 or OR gate 11 may be disabled (high impedance output) for TDO_EV high or low, respectively. An event may advantageously be reported with a high level on TDO for one clock signal.

Figure 10:
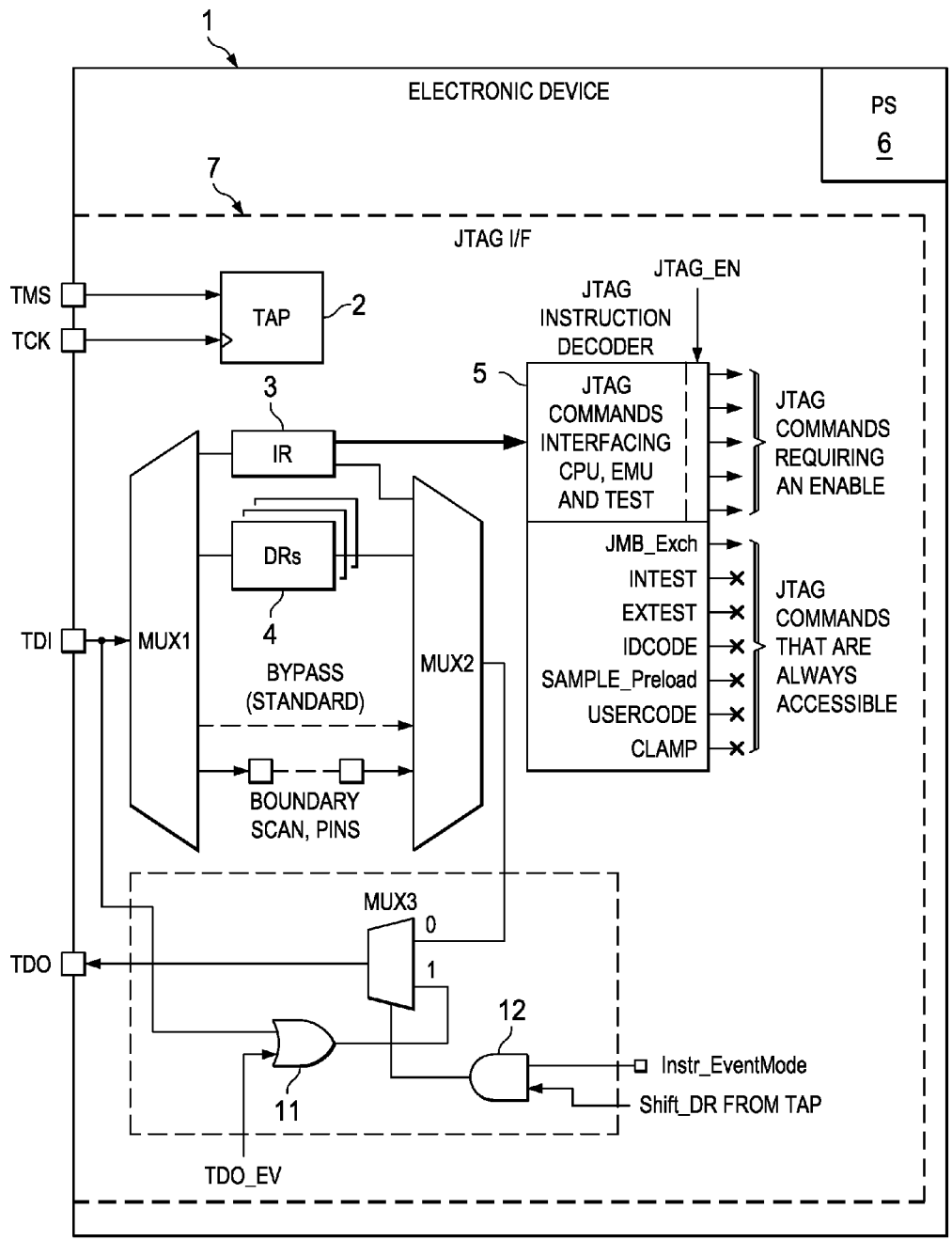
FIG. 10 is a block and circuit diagram of an electronic device according to an embodiment of the invention with synchronous event reporting and scan event mode.

FIG. 10 is a block and circuit diagram of electronic device 1 according to an embodiment of the invention with synchronous event reporting and scan event mode. Electronic device 1 in FIG. 10 is similar to electronic device 1 of FIG. 9. The embodiment of FIG. 10 includes an additional gate 12 (AND gate 12) and a third multiplexer MUX3. The output of gate 11 supplies one input of MUX3. The output of multiplexer MUX3 is coupled to output pin TDO. Multiplexer MUX3 is controlled by signals INSTR_EVENTMODE and SHIFT_DR from TAP controller 2. These signals are gated through AND gate 12. Signal INSTR_EVENTMODE signal indicates a scan event mode of electronic device 1 previously described. Events or event related data are passed through the JTAG port from TDI to TDO in the scan event mode. JTAG instruction decoder 5 issues signal INSTR_EVENTMODE. Instruction decoder 5 interprets a corresponding instruction in instruction register IR 3. Signal SHIFT_DR is an internal signal of TAP controller 2. In this embodiment, signal SHIFT_DR is assumed to be high, when data is shifted which is different from the embodiment of FIG. 4. FIG. 29 below is a corresponding state diagram. If either SHIFT_DR or INSTR_EVENTMODE is low, the output of AND gate 12 is also low regardless of the other signal and MUX3 connects the output of MUX2 to TDO allowing normal operation of the JTAG port 7. The contents of the boundary scan registers may then be passed through MUX2 and MUX3 to output pin TDO. If both SHIFT_DR and INSTR_EVENTMODE are high indicating electronic device 1 is in scan event mode and in SHIFT_DR state, then multiplexer MUX3 passes data either from TDI or TDO_EV (for example register 10 containing event related data) though OR gate 11 to TDO as long as the other signal TDO_EV or signal TDI remains high. Events or event related data passes asynchronously and directly to pin TDO. A private register stores event related data. Register 10 shown in FIG. 7 may be such a register. If electronic device 1 is in scan event mode where INSTR_EVENTMODE is high and the device is configured to shift data from the register where SHIFT_DR is also high, the register content is serially fed from pin TDO_EV to pin TDO.

Figure 11:
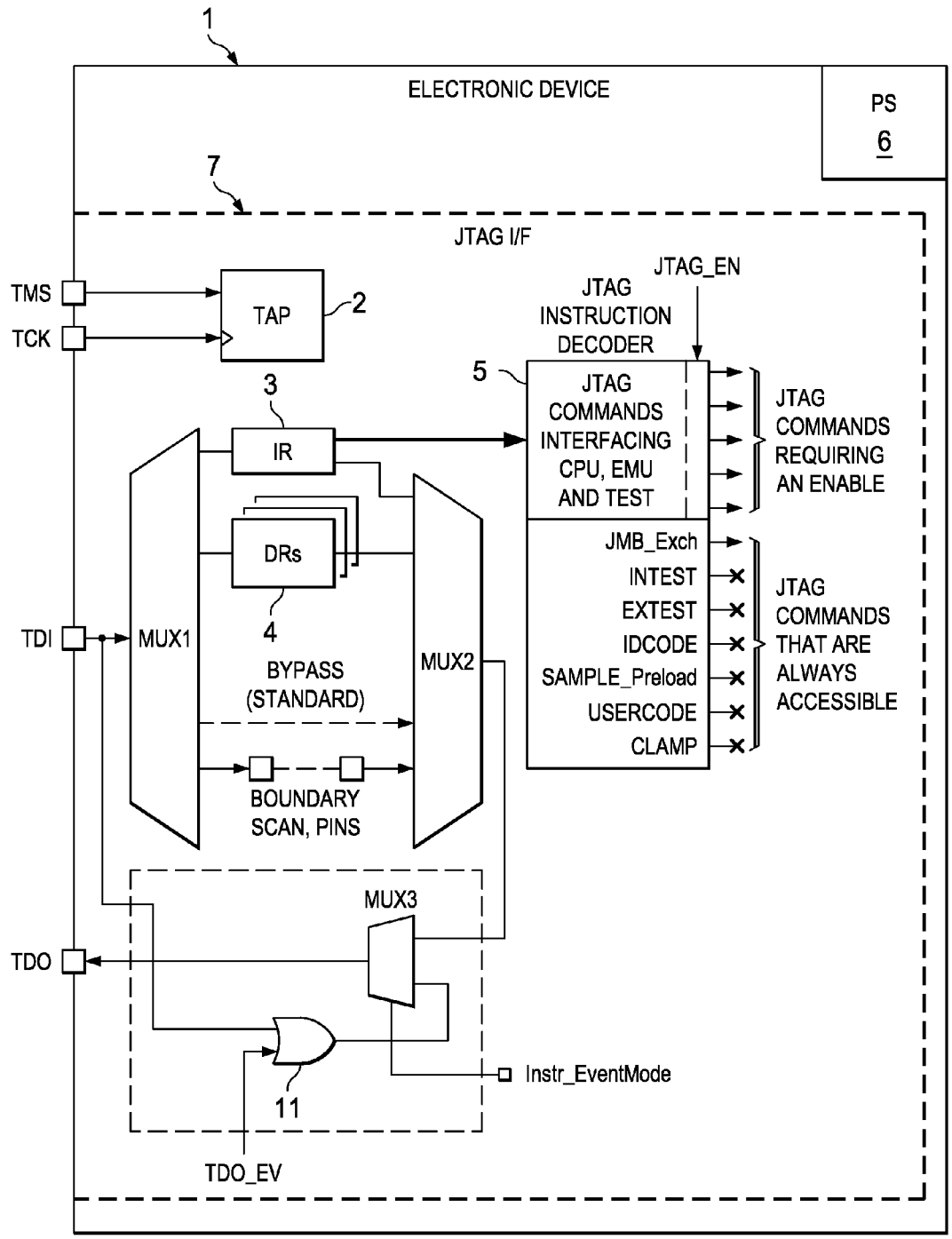
FIG. 11 is a block and circuit diagram of an electronic device according to an embodiment of the invention with asynchronous event reporting and scan event mode.

FIG. 11 is a block and circuit diagram of electronic device 1 according to an embodiment of the invention with asynchronous event reporting and scan event mode. In this embodiment, only INSTR_EVENTMODE switches between normal operation and scan event mode.

Figure 12:
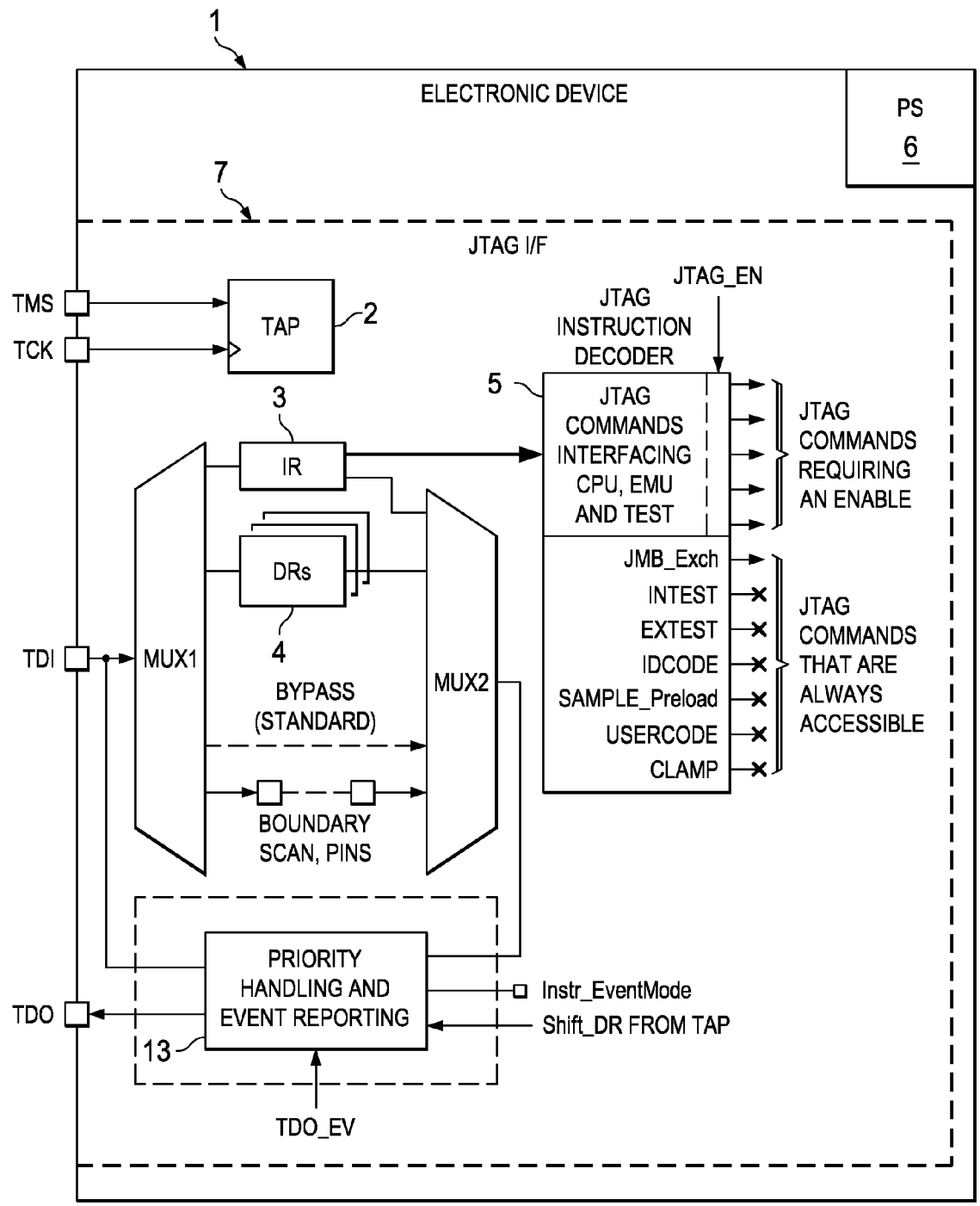
FIG. 12 is a block and circuit diagram of an electronic device according to an embodiment of the invention with asynchronous event reporting and prioritization.
Figure 18:
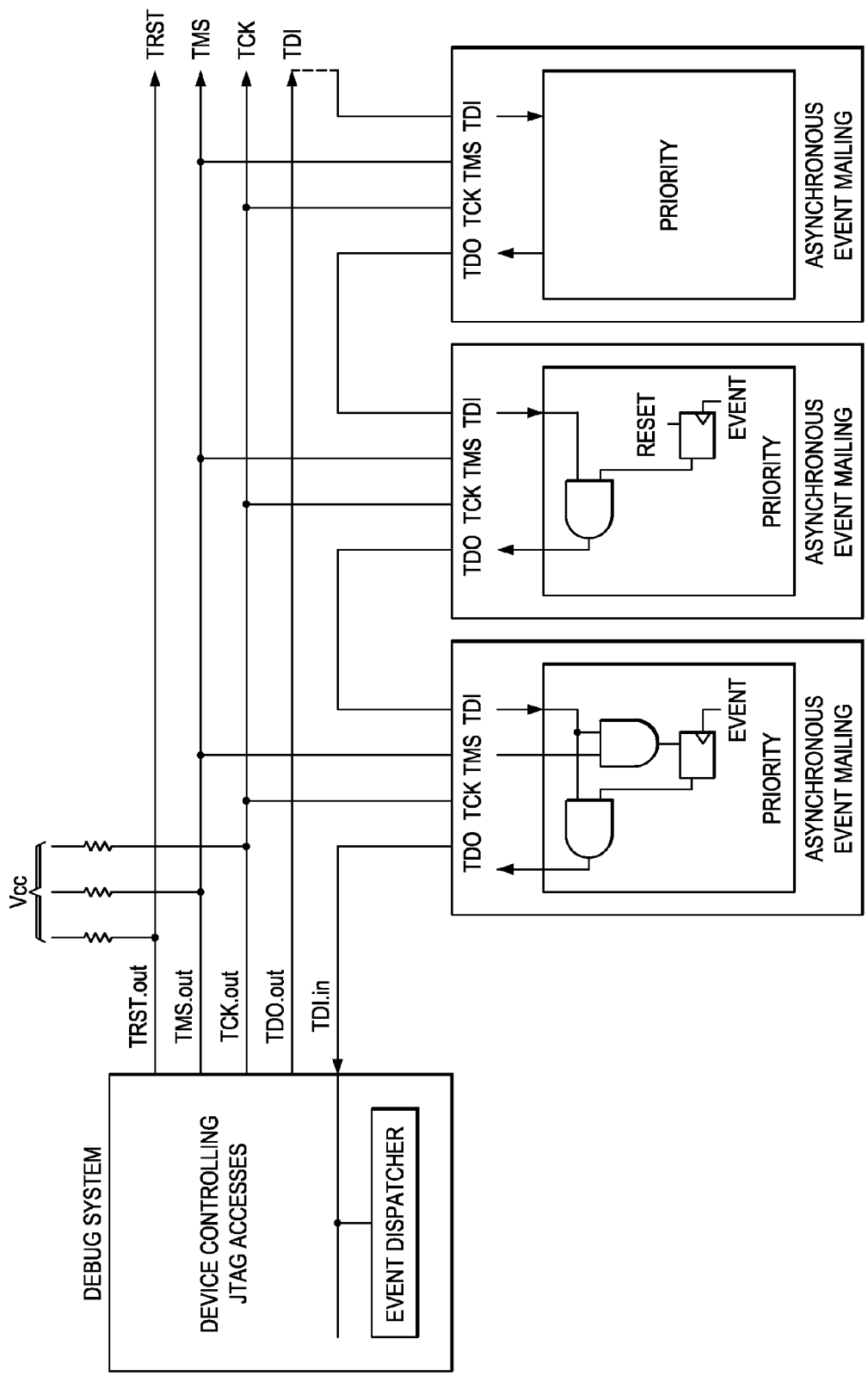
FIG. 18 is a circuit diagram of a system according to an embodiment of the invention with asynchronous event mailing and hardwired prioritization.
Figure 19:
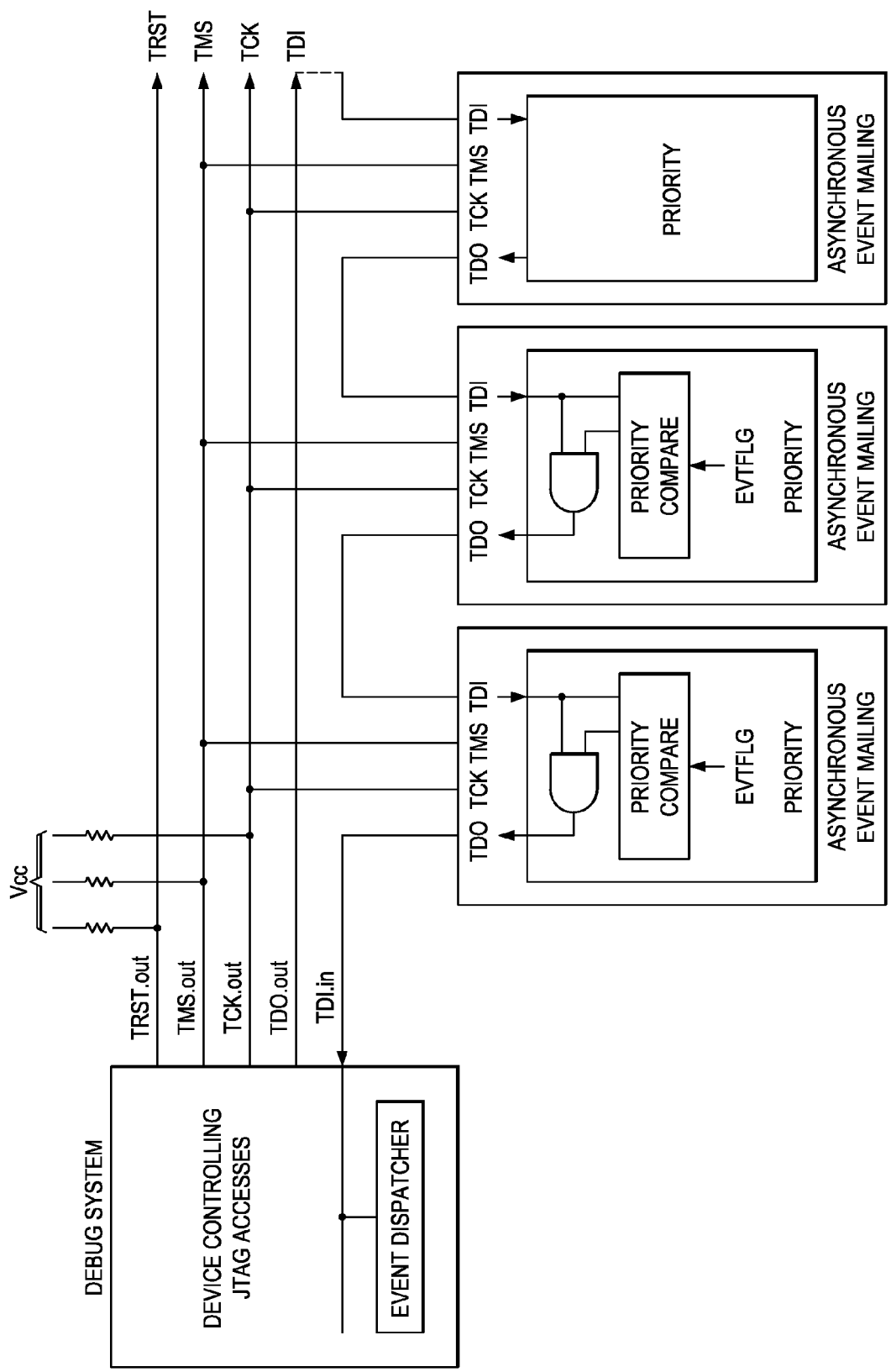
FIG. 19 is a circuit diagram of a system according to an embodiment of the invention with asynchronous event mailing, hardwired prioritization and device selection.

FIG. 12 is a block and circuit diagram of electronic device 1 according to an embodiment of the invention with asynchronous event reporting and prioritization. Priority handling and event reporting stage 13 is coupled to test data input pin TDI and test data output pin TDO. Priority handling and event reporting stage 13 receives the INSTR_EVENTMODE signal indicating event scan mode, a SHIFT_DR signal indicating that TAP controller 2 is in data shift mode SHIFT_DR and a data signal TDO_EV relating to an event which is to be reported. Priority handling and event reporting stage 13 reports events from pin TDI or internal events received from processing stage 6 in response to these signals in accordance with a priority scheme. The priority scheme may be software based or hardwired based through a daisy chain. Priority handling and event reporting stage 13 processes and outputs event related data in accordance with an event priority. FIGS. 18 to 20 show systems with different priority schemes further detailed below.

Figure 13:
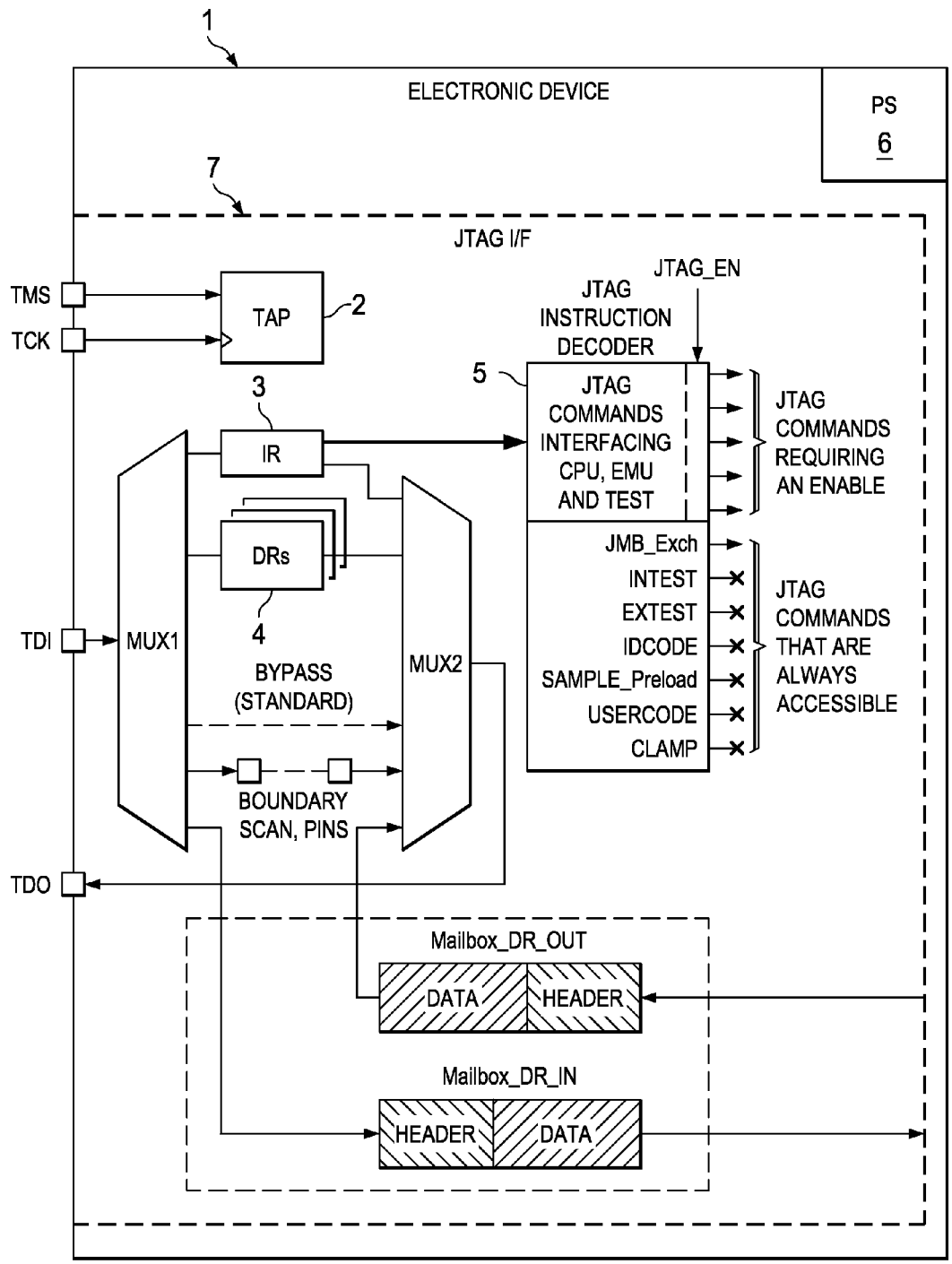
FIG. 13 is a block and circuit diagram of an electronic device according to an embodiment of the invention with extended JTAG mailbox registers.

FIG. 13 is a block and circuit diagram of electronic device 1 according to an embodiment of the invention with extended JTAG mailbox registers. JTAG mailbox 8 is coupled between multiplexers MUX1 and MUX2. JTAG mailbox 8 and registers 9 and 10 are comparable with those shown in FIG. 7. Registers 9 and 10 are extended in this embodiment. Registers 9 and 10 contain data with at least one bit as a header configured identify the data. The identifier or header may then provide information about the content, target and purpose of the data in the register.

Figure 14:
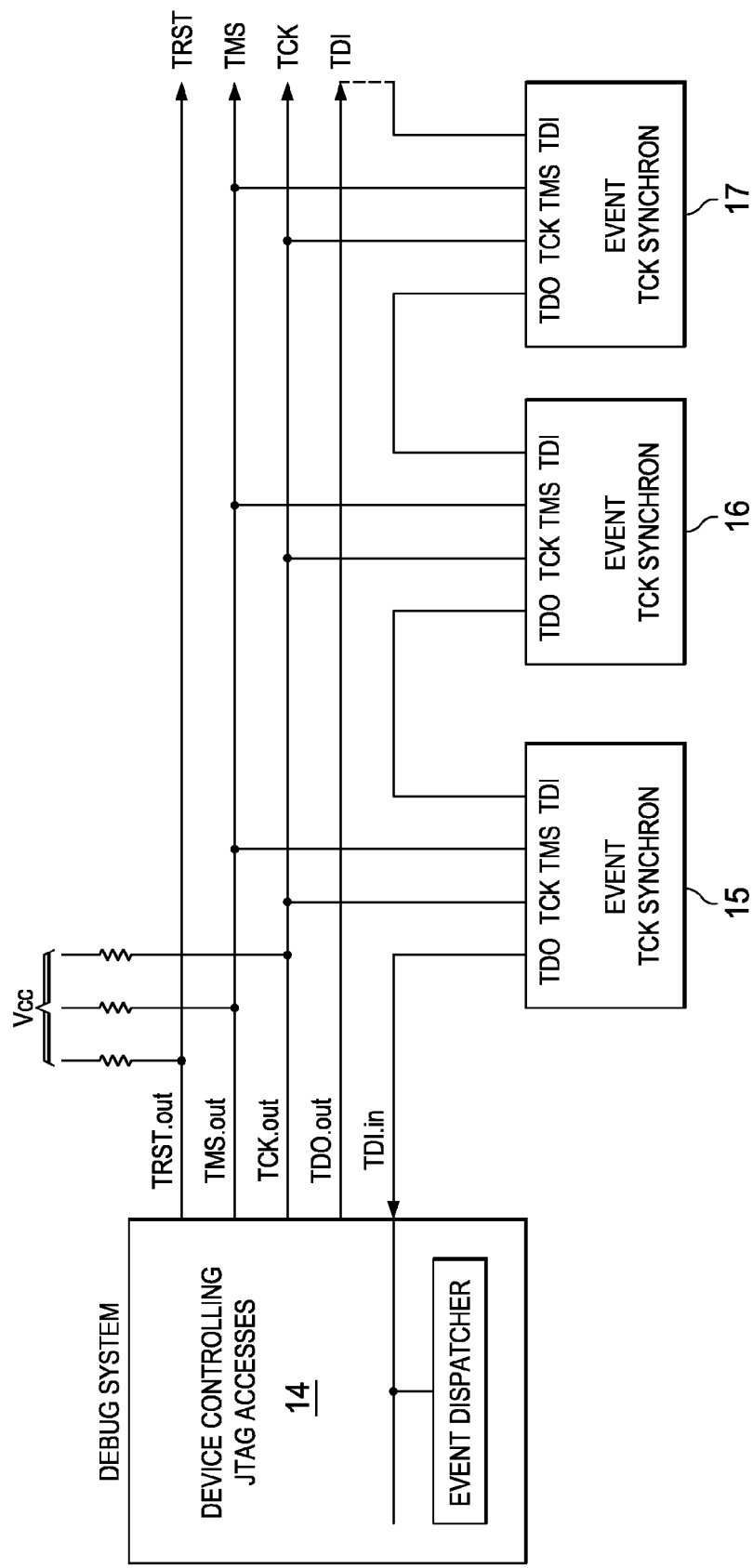
FIG. 14 is a circuit diagram of a system according to an embodiment of the invention with synchronous event reporting and propagation.

FIG. 14 is circuit diagram of a system according to an embodiment of the invention with synchronous event reporting and propagation. The system includes electronic devices 14 to 17 implemented in accordance to the invention. Electronic devices 15, 16 and 17 are coupled in a daisy chain. The JTAG ports of electronic devices 15, 16 and 17 are configured as shown in FIG. 7 or 8. Electronic device 14 is the debug system. The JTAG port of electronic device 14 complies with the JTAG ports of devices 15, 16 and 17. Electronic devices 14, 15, 16 and 17 comply with a specific data protocol for the JTAG ports. In this embodiment, the data protocol relates to synchronous event reporting. Debug device 14 has an event dispatcher organizing, sending and receiving events and event related data to and from the electronic devices 15, 16 and 17. The exchange of events and event related data is performed via lines TMS, TCK, TDI and TDO only. In particular, lines TDI and TDO are used as described above with respect to the various embodiments and aspects of the invention.

Figure 15:
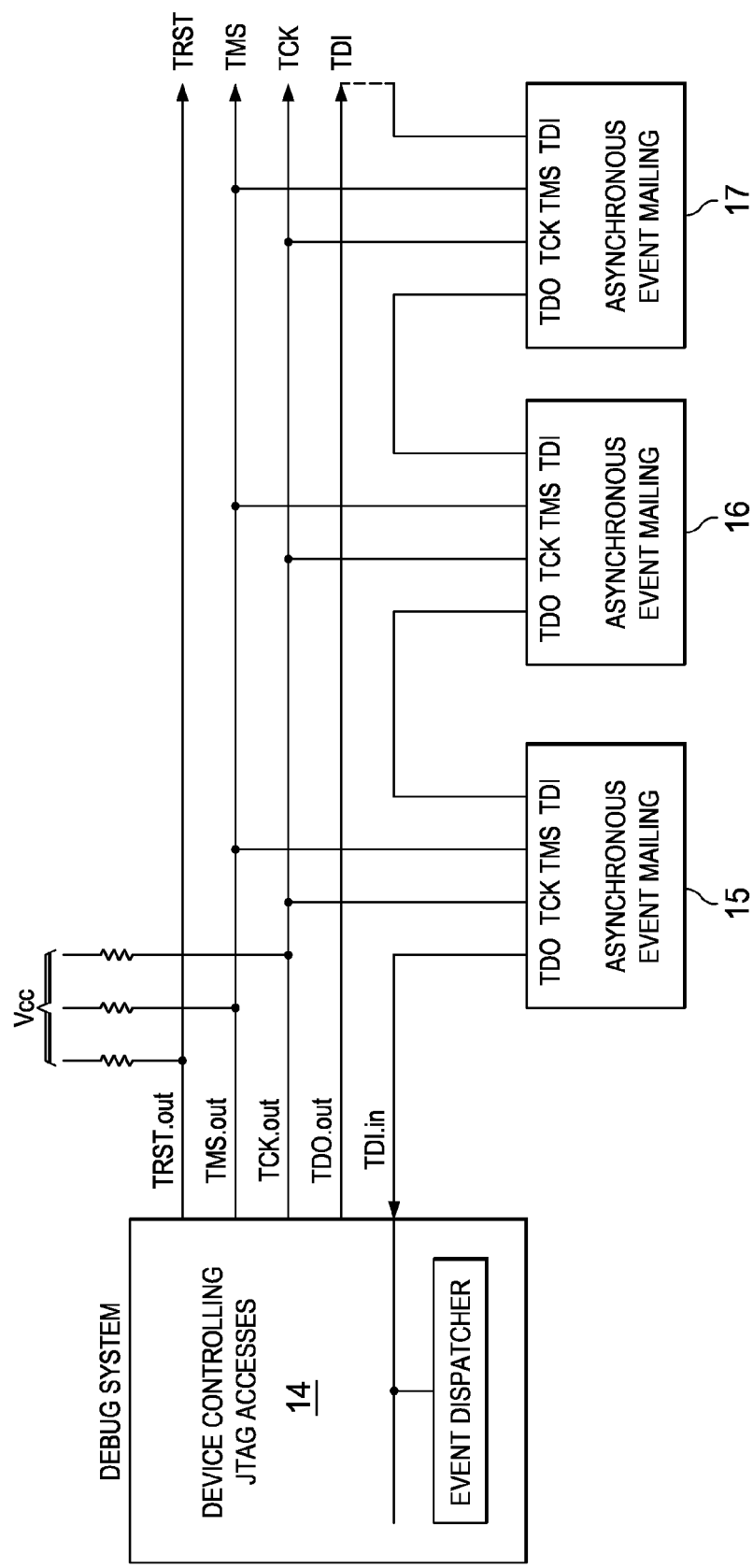
FIG. 15 is a circuit diagram of a system according to an embodiment of the invention with asynchronous event mailing.
Figure 16:
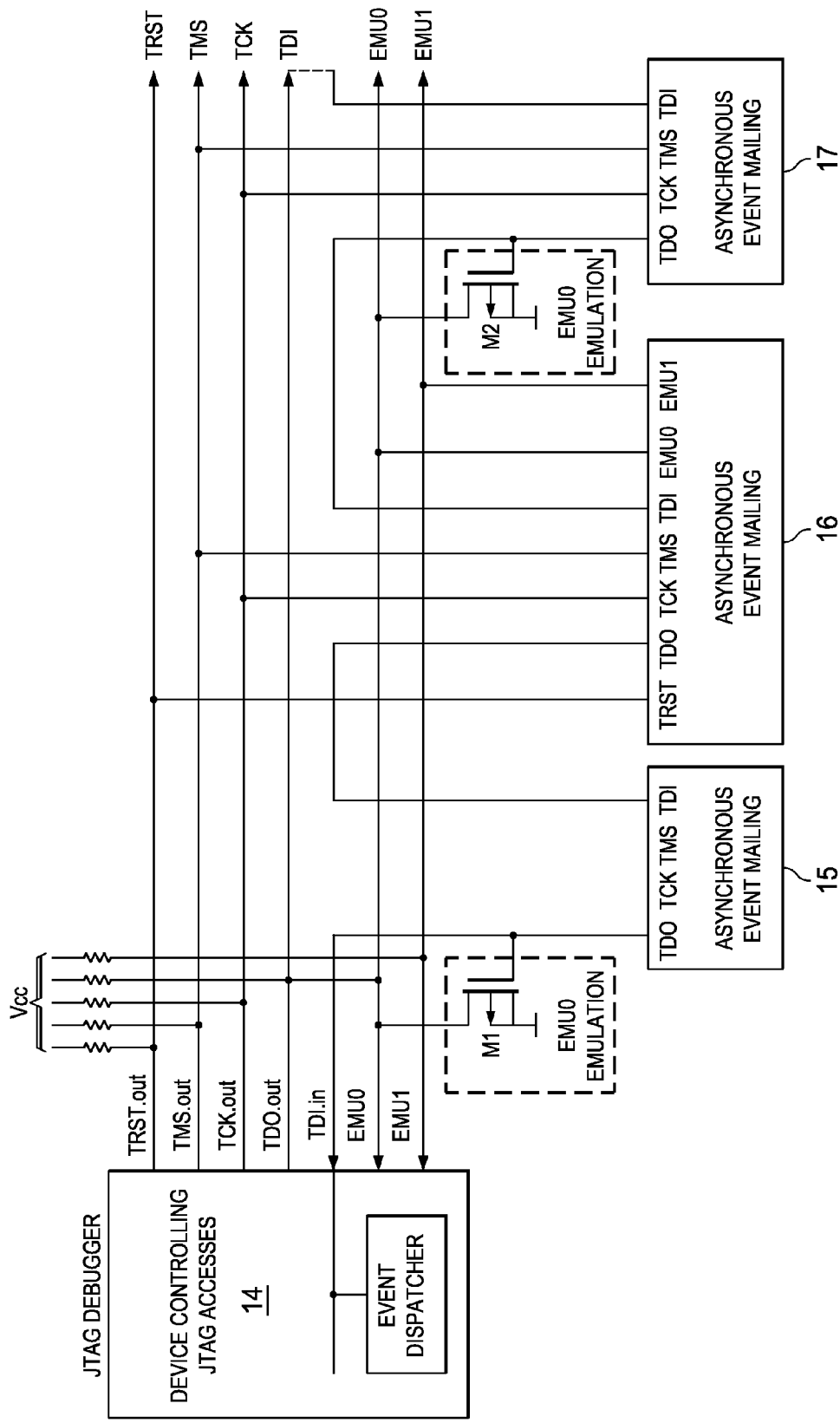
FIG. 16 is a circuit diagram of a system according to an embodiment of the invention with asynchronous event mailing in combination with devices having emulation extended JTAG ports.

FIG. 15 is a circuit diagram of a system according to an embodiment of the invention with asynchronous event mailing. The system of FIG. 15 is similar to the embodiment of FIG. 14 except that debug electronic device 14 and electronic devices 15 to 17 support asynchronous event exchange. Electronic devices 14 to 17 may therefore be implemented in accordance with the embodiments shown in FIGS. 7 and 9 to 12, FIG. 16 is circuit diagram of a system according to an embodiment of the invention having asynchronous event mailing in combination with devices having emulation extended JTAG ports. In the embodiment of FIG. 16 a device with a normal set of JTAG pins configured in accordance with the aspects and embodiments of the invention noted above is used in combination with electronic devices having an extended JTAG port with emulation lines EMU0 and EMU1. Electronic devices 15 and 17 are associated with respective MOSFETs M1 and M2. MOSFETs M1 and M2 are coupled with a channel between line EMU0 and ground. The control gate of transistor M1 is coupled to the TDO output of electronic device 15. The control gate of transistor M2 is coupled to the TDO output of electronic device 17. Emulation line EMU0 may then be pulled down using TDO output of devices 15 and 17. Devices and systems according to aspects of the invention can easily be adjusted to operate with conventional JTAG devices having extended JTAG ports.

Figure 17:
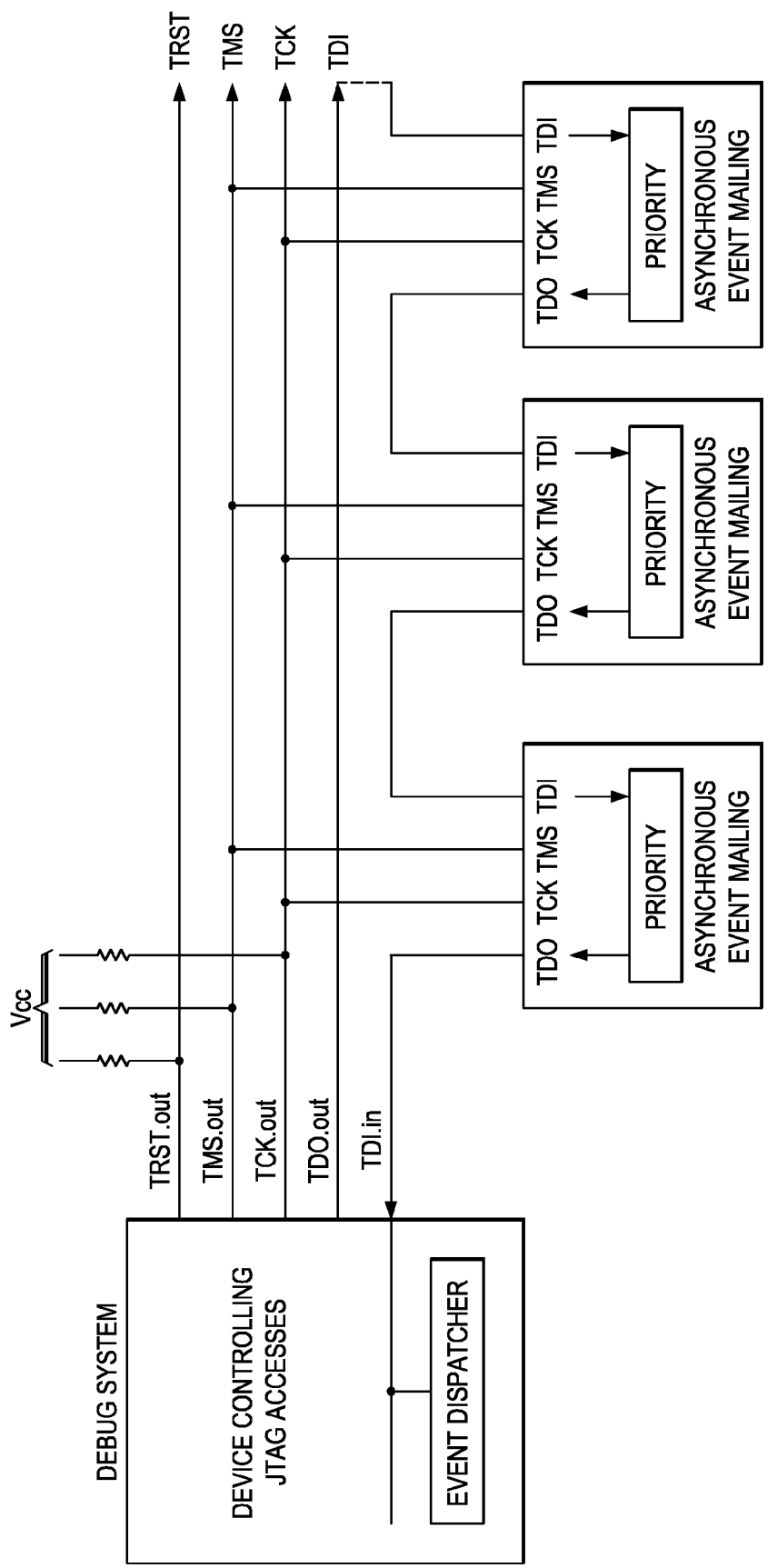
FIG. 17 is a circuit diagram of a system according to an embodiment of the invention with asynchronous event mailing and prioritization.

FIG. 17 is circuit diagram of a system according to an embodiment of the invention with asynchronous event mailing and prioritization. Various electronic devices 14, 15, 16 and 17 are coupled in a daisy chain configuration for testing and emulating electronic devices 15, 16 and 17 via debug or test electronic device 14. Events in electronic devices 15, 16 and 17 may occur simultaneously. In one embodiment only the electronic device with the highest priority is enabled to report an event. If all event related data is read from the electronic device with the highest priority, a flag is set. This event flag may be reset through the normal JTAG communication scheme. In one embodiment a chained priority can be used where the position of a particular device in the JTAG daisy chain determines priority. Each device may then have its time slot for the event messaging defined through its position in the chain. In another embodiment (FIG. 19), the priority and the time slot of a device is programmable. The physical position then has no impact on the priority and the time slot for reporting an event. This is referred to as programmable priority.

FIG. 18 is a circuit diagram of a system according to an embodiment of the invention with asynchronous event mailing and hardwired prioritization. This embodiment uses a daisy chain implementing a hardwired priority scheme. A first event flag is reset after being acknowledged as highest priority. The acknowledged or accepted highest priority is latched (frozen) and any following change among the DUTs 15, 16 and 17 will have no effect.

FIG. 19 is a circuit diagram of a system according to an embodiment of the invention with asynchronous event mailing, hardwired prioritization and device selection. In this embodiment, one of the electronic devices 15, 16 or 17 is selected for reporting an event. This selected electronic device has the highest priority for its event.

FIG. 20 is a state diagram of a TAP controller of a JTAG port according to an embodiment of the invention. The state diagram is similar to the prior art state diagram of FIG. 4. FIG. 20 illustrates an additional SHIFT_DR state referred to as SHIFT_DR (Ev-Sc) state. This is a special SHIFT_DR state for the scan event mode. The TAP controller provides a scan event mode where events can be scanned and shifted out through the TDO as explained with respect to various embodiments of the invention. The special data shift mode for event scanning is reached through a level change of signal TMS on the TMS input pin. The JTAG data and communication protocol is therefore supplement by several features. Once the normal data shift mode SHIFT_DR is reached as detailed in FIG. 4, a level change of signal TMS from low to high may be performed. The electronic device is then switched into event scan mode if clock signal TCK remains low. If the TMS level is switched back to low and TCK is still low, the electronic device leaves the scan event mode.

Figure 21:
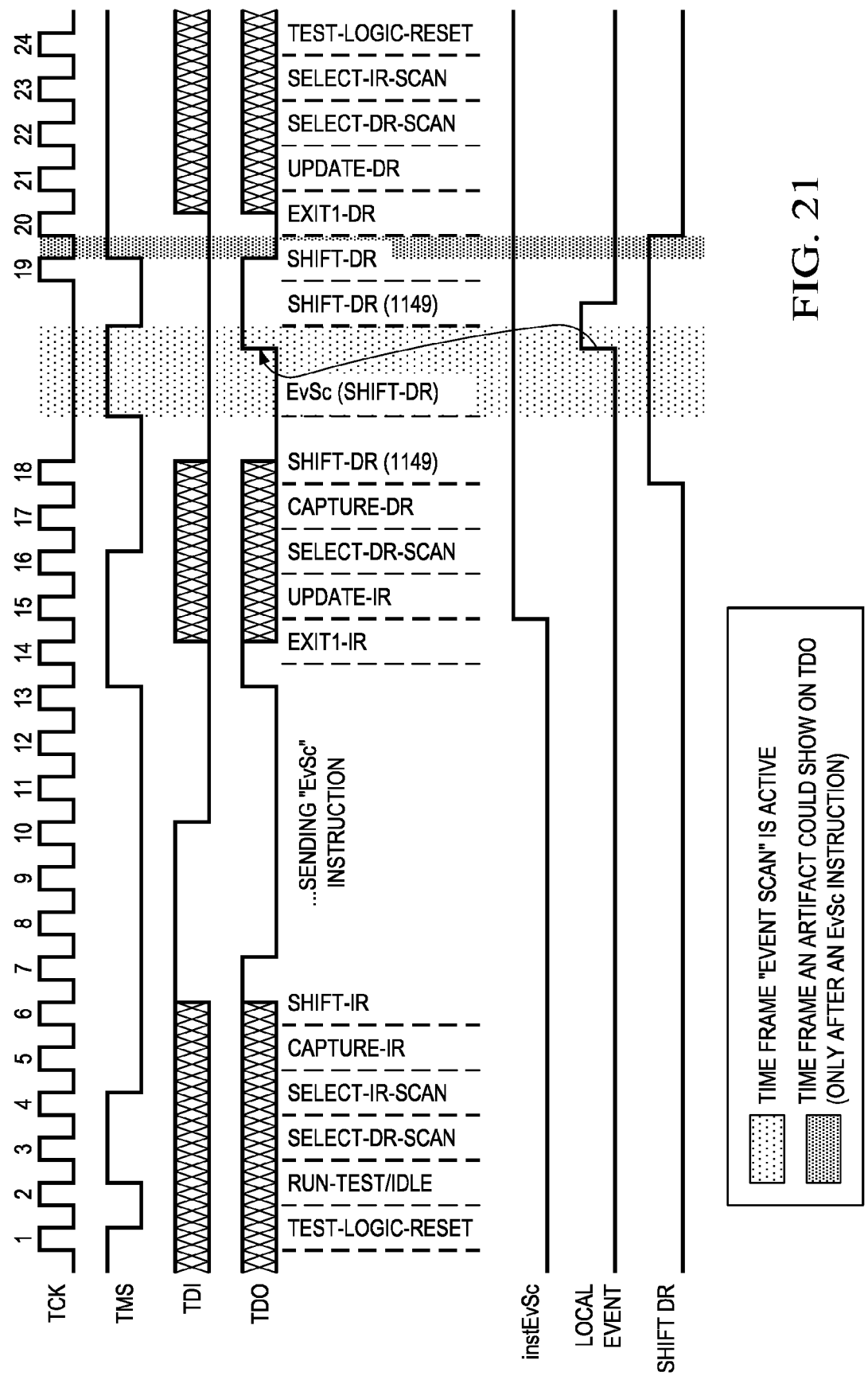
FIG. 21 illustrates waveforms of aspects of a scan event mode according to aspects of the invention.

FIG. 21 illustrates waveforms of aspects of a scan event mode according to the invention. The instructions shown in FIG. 21 refer to FIG. 20 showing the corresponding states. As indicated below signal TDO, the TAP controller can proceed through states Test-Logic-Reset, Run-Test/Idle, Select-DR-Scan, Select-IR-Scan and Capture-IR to state Shift-IR. The TMS level is toggled to proceed from step to step synchronous to the clock TCK. Upon entering Shift-IR the system passes an Ev-Sc instruction the through pin TDI into IR register. The instruction register updates in the state Update_IR at clock cycle 15. TMS is toggled so as to reach state Shift-DR (1149) through states Select-DR-Scan and Capture-DR. The number 1149 refers to the standard and indicates the normal Shift-DR state. Upon a additional level change of a rising slope of TMS the systems proceeds from Shift-DR (1149) to event scan mode Ev-Sc (Shift-DR). Scan event mode is active until TMS is set to logic low again. As long as TMS is high indicating that event scan is active, local events are directly reported to the TDO pin. FIG. 21 indicates this via an arrow from signal local event to a rising edge of signal TDO. The event is reported through pin TDO. A short time after starting reporting the event, TMS becomes low leaving the event scan mode. The TAP controller or electronic device returns to Shift-DR (1149) mode and proceeds from there through states Exit1-DR, Update-DR, Select-DR-Scan, Select-IR-Scan to state Test-Logic-Reset. A time frame artifact may appear on TDO. TDO can only change with a falling edge of TCK. A direct transition from event scan mode (Ev-Sv) to Exit1-DR state is impossible. The TAP controller has to re-enter Shift-DR (1149) mode. In this mode, an artifact can occur on TDO for example TDO may be high during a time slot at which it should be low or vice versa. The artifact may influence the order of handling the events and the priority scheme. The circuit illustrated in FIG. 21 prevents this.

Figure 22:
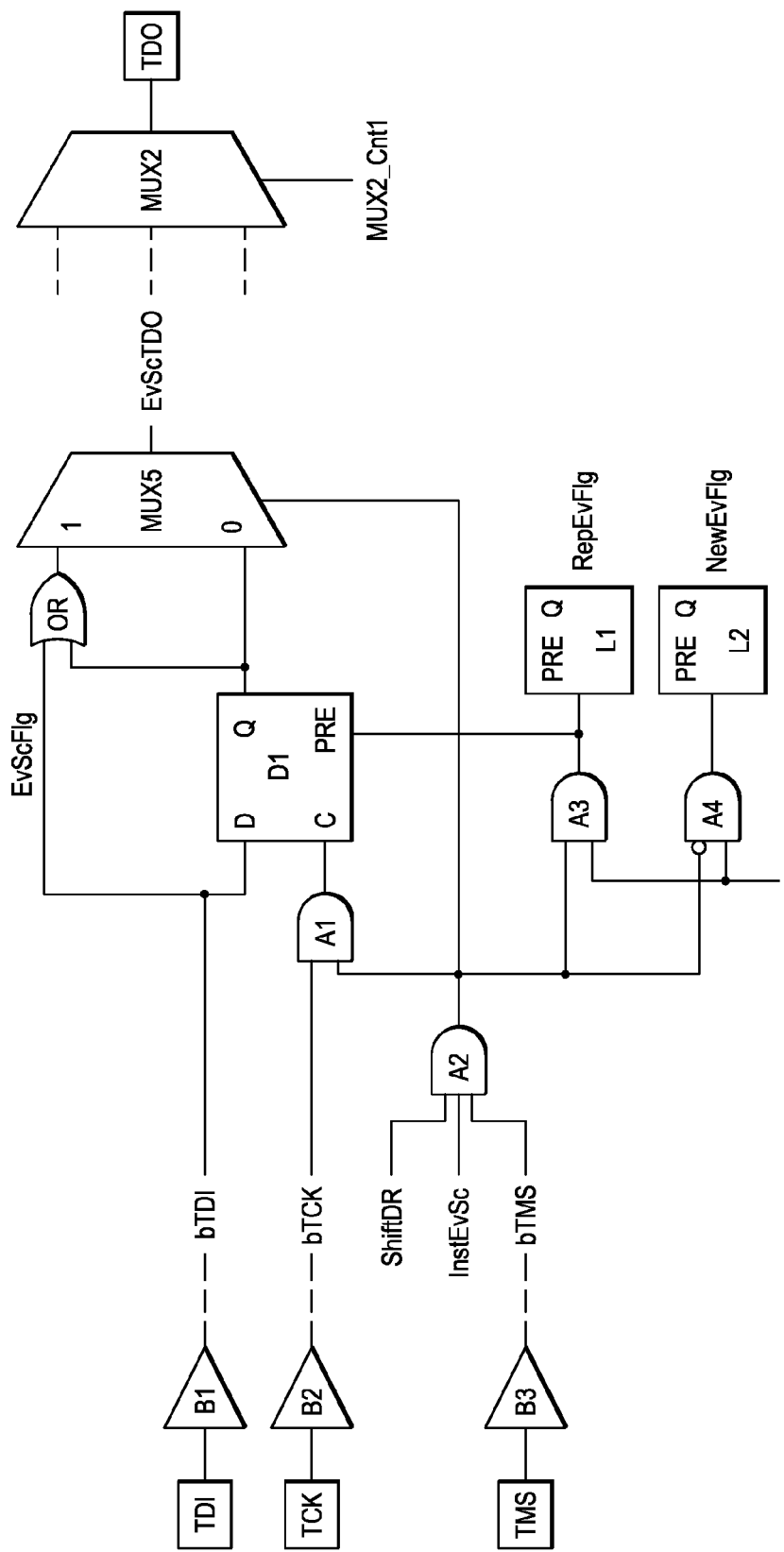
FIG. 22 is a circuit diagram of a part of a JTAG port with a scan event mode according to aspects of the invention.

FIG. 22 is a circuit diagram of a part of a JTAG port with scan event mode according to aspects of the invention. There is a bypass for higher priority events from TDI through and OR gate, multiplexer MUX5 to TDO. Local events are processed using AND gates A1, A2, A3, A4, flip-flop D1 and reported through multiplexer MUX5 to TDO.

Signals TDI, TCK and TMS are buffered with respective buffers B1, B2 and B3. A small b (such as bTDI) indicates the buffered signal. Signal Shift-DR which is high when in the scan event Shift-DR state of FIG. 20, signal InstEvSc which indicates that an instruction to switch into scan event mode has been received in instruction register IR and the buffered test mode signal bTMS are input to AND gate A2. The output of AND gate A2 supplies a control input of multiplexer MUX5. The output of AND gate A2 is also coupled to one input of AND gate A1, the other input of AND gate A2 receives bTCK. The output of AND gate A2 also supplied an input of AND gates A3 and A4. AND gates A3 and A4 receive a local event at their other input. Buffered data signal bTDI is one input of the OR gate. The other input of the OR gate is an output Q of flip-flop D1 which receives at an data input D signal bTDI. Flip-flop D1 is clocked with output signal of AND gate A1. The outputs of AND gates A3 and A4 supply latches L1, L2. Latch L1 provides at an output Q, the report event flag RepEvFlg. Latch L2 produces the report event flag NewEvFlg. SHIFT-DR is a status signal from JTAG TAP controller. SHIFT-DR is high while JTAG TAP controller is in SHIFT-DR state. Signal EvScTDO is a signal passed to TDO while the event scan instruction is active. Signal InstEvSc is the event scan instruction state from JTAG instruction decoder as shown in FIG. 11. Multiplexer MUX2 for the TDO signal is controlled by a control signal MUX2_Cntl which may be the instruction event scan mode signal Instr_EventMode of FIG. 11. This signal is active as long as the instruction register IR decodes as a request for an event scan. The event scan event flag EvScFlg can only be set when in TMS low phase in a clock less shift-DR state after an event scan instruction. The value of EvScFlg is lost after data is reported and shifted to the JTAG host. The reported event flag RepEvFlg: contains a copy of the event reported. This flag captures the data reported and can only be set when in TMS low phase in a clock less shift-DR state after an event scan instruction. The new event flag NewEvFlg captures late or unexpected events in phases when the RepEvFlg is not active.

The preparation for activating an event scan mode can be briefly summarized as follows: an event scan instruction is passed into the JTAG instruction register IR; the TAP controller is switched into Shift-DR state; and TMS is changed to high without generating any further clock changes on TCK.

A change of TMS to high after an event scan instruction is in the IR register and the TAP controller is in Shift-DR state, ties all JTAG controlled electronic devices together in one long event daisy chain. A local event at any of these electronic devices sets the local EvScFlg and the RepEvFlg. An electronic device can then indicate events as a logical high transition on TDO as soon an event occurs. TMS is then changed to low again in order to shift out the data of a single or multiple events stored in data registers. A low level on TMS also ties all devices together to form one shift register reporting which of the electronic device(s) has a pending local event and needs to be served. The order in which the events or interrupts of the various devices are handled is up to software, based on a table in the board configuration file.

The EvScFlg flags are automatically cleared during the shift process after the event scan by shifting in active zeros from the JTAG host controller. The RepEvFlg and NewEvFlg flags are cleared by regular JTAG operations. The EvScFlg is not a regular data register element. In the IEEE 1149.1 standard data registers are split into shift-registers and buffer-registers. Some implementations always use pairs of those registers to build alternate DR-scan chains. Other embodiments use one common shift register with variable length to reduce the number of gates. Both implementations do not immediately hand-on events. Events will set the buffers that can be polled again. However, the EvScFlg chain according to this embodiment allows an immediate handling and messaging of events.

Figure 23:
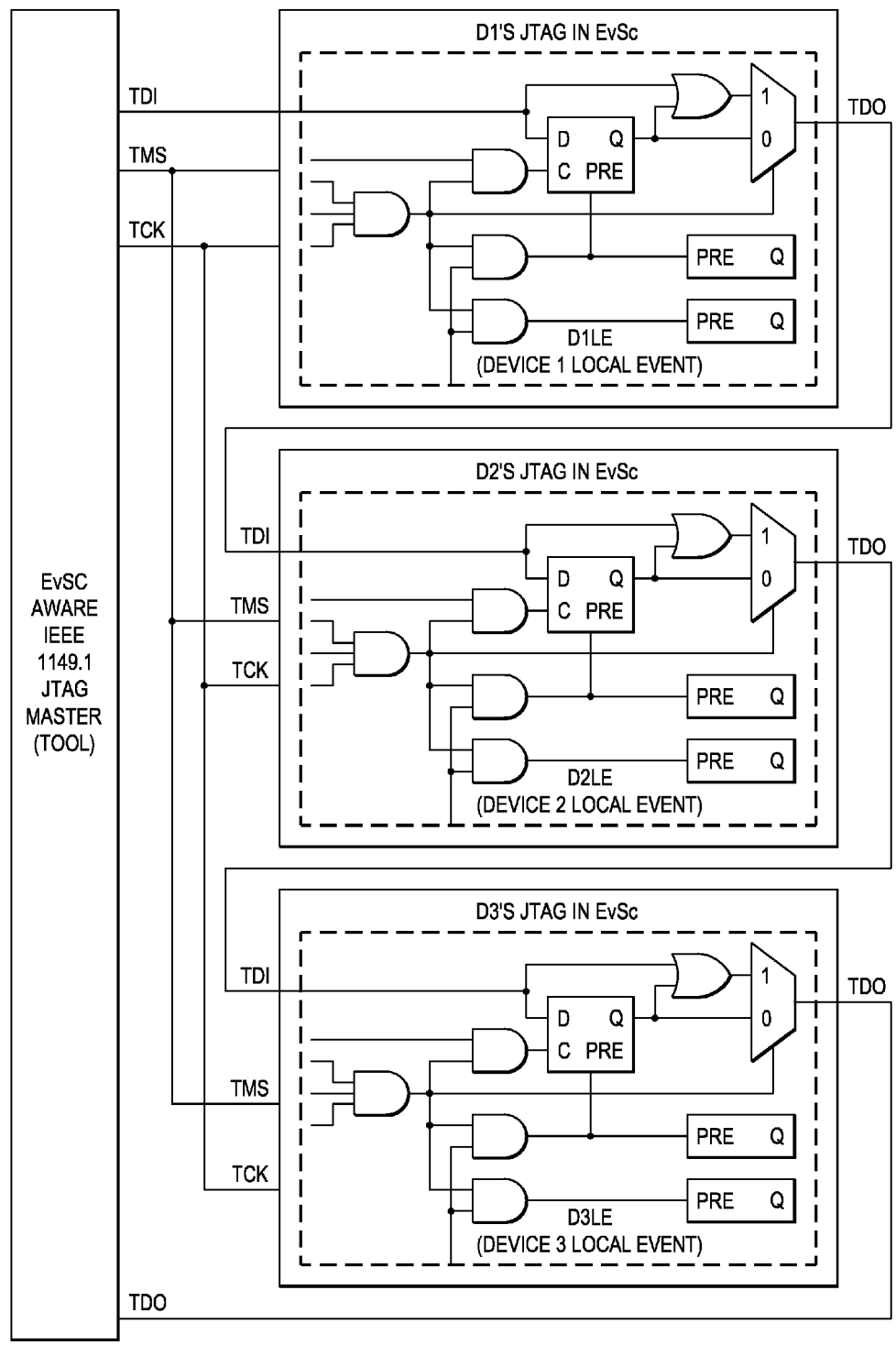
FIG. 23 is a circuit diagram of a system according to aspects of the invention configured to use scan chain mode.

FIG. 23 is a circuit diagram of a system implemented in accordance with aspects of the invention. Electronic devices D1, D2 and D3 include a JTAG port implemented in accordance with the embodiment shown in FIG. 22. A scan event aware JTAG master controls the event scan procedure.

Figure 24:
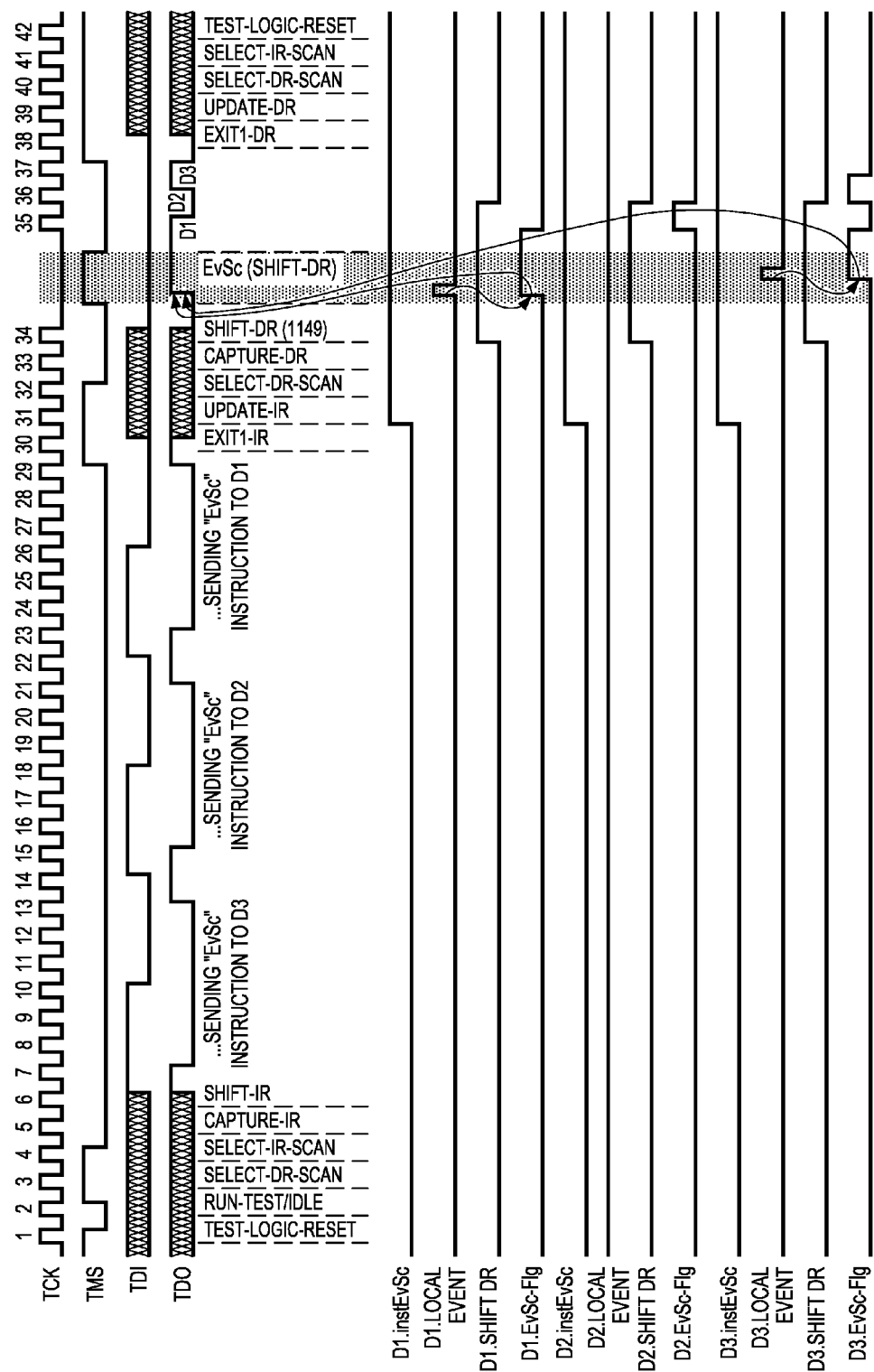
FIG. 24 illustrates waveforms of aspects of a scan event mode according to the invention.

FIG. 24 illustrates aspects of waveforms of a scan event mode of the embodiment of FIG. 23. The states within the tap controllers of each of the devices D1, D2 and D3 are similar to FIG. 21. In this embodiment the internal signals InstEvSc, local event, shift-DR, EvScFlg are shown for each of the three devices indicated by respective prefixes D1 to D3. In state Shift-IR the respective three instructions for entering into event scan mode are passed to devices D3, D2 and D1 consecutively through the daisy chain. A level change of TMS simultaneously switches all electronic devices into an active scan event mode. After local events in devices D1 and D3 during the active time frame, the respective event scan flags D1.EvScFlg and D3.EvScFlg are set to high. On clock cycle 34, no further power is consumed. The first event which occurs is immediately reported on the TDO line. The last device D1 in the JTAG chain may be the first to report. During clock cycles 36, 37 and 38, the individual devices D1, D2 and D3 shift out their event reports (high for an event, and low if no event occurred). This example implements a chained priority where the position in the chain defines the time slot and the priority. In another embodiment, the prioritization may be programmed and the time slots (clock cycles 36, 37 and 38) may relate to different devices or events.

What is claimed is:
1. An electronic device comprising:
a processing stage having a JTAG port with a test data input pin (TDI), a test data output pin (TDO), a test mode select pin (TMS) and a test clock pin (TCK);
a test access port (TAP) controller having a data register (DR) shift state and an instruction register shift (IR) state; and
wherein said electronic device is operable in a scan event mode to automatically map an incoming event to said TDO pin.
2. The electronic device of claim 1, wherein:
said electronic device is further operable to automatically forward an event received through said TDI pin to said TDO pin when operating in said scan event mode.
3. An electronic device comprising:
a processing stage having a JTAG port with a test data input pin (TDI), a test data output pin (TDO), a test mode select pin (TMS) and a test clock pin (TCK), a test access port (TAP) controller having a data register (DR) shift state and an instruction register shift (IR) state; and
a first register storing an event for the processing stage received through said TDI pin.
4. The electronic device of claim 3, wherein:
said first register includes a flag indicating to said processing stage that said event is stored in said first register.
5. The electronic device of claim 3, wherein:
said first register is operable to issue an interrupt to said processing stage in response to reception of said event.
6. The electronic device of claim 3, further comprising:
a second register storing an event received from said processing stage.
7. The electronic device of claim 6, wherein:
said electronic device is further operable to feed an event from said second register as serial data to said TDO pin.
8. The electronic device according to claim 7, wherein:
said electronic device is further operable to feed said event to said TDO pin during a DR-shift state of said TAP controller.
9. The electronic device according to claim 8, wherein:
said TDI pin and said TDO pin are coupled to asynchronously feed a received high level event from said TDI pin to said TDO pin.
10. A testing system comprising:
a first electronic device having a JTAG port and configurable as a master device;
a second electronic device having a JTAG port;

wherein said first electronic device is coupled to said second electronic device through said JTAG port for testing said second electronic device; and wherein said second electronic device is configured to receive an event automatically transmitted from a TDO pin of said JTAG port.

11. A method of operating an electronic device having a JTAG port, comprising the steps of:

sending an instruction to the electronic device via the JTAG port;

switching the electronic device into a scan event mode automatically reporting an event through a TDO pin of the JTAG pin in response to the instruction.

12. A system comprising:

a plurality of electronic devices each having JTAG ports;

wherein said electronic devices are coupled in a daisy chain through respective TDI pins and TDO pins of their respective JTAG ports and the JTAG ports are configured to asynchronously forward events.

* * * * *